United States Patent
Lilak et al.

(10) Patent No.: US 11,075,198 B2
(45) Date of Patent: Jul. 27, 2021

(54) STACKED TRANSISTOR ARCHITECTURE HAVING DIVERSE FIN GEOMETRY

(71) Applicant: INTEL CORPORATION, Santa Clara, CA (US)

(72) Inventors: Aaron D. Lilak, Beaverton, OR (US); Cheng-ying Huang, Hillsboro, OR (US); Gilbert Dewey, Beaverton, OR (US); Willy Rachmady, Beaverton, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/647,688

(22) PCT Filed: Jan. 8, 2018

(86) PCT No.: PCT/US2018/012734
§ 371 (c)(1),
(2) Date: Mar. 16, 2020

(87) PCT Pub. No.: WO2019/135766
PCT Pub. Date: Jul. 11, 2019

(65) Prior Publication Data
US 2020/0235092 A1    Jul. 23, 2020

(51) Int. Cl.
*H01L 25/065* (2006.01)
*H01L 27/06* (2006.01)
(Continued)

(52) U.S. Cl.
CPC ...... *H01L 27/0688* (2013.01); *H01L 21/8221* (2013.01); *H01L 21/823807* (2013.01);
(Continued)

(58) Field of Classification Search
CPC ............. H01L 27/0688; H01L 27/0924; H01L 27/1211; H01L 27/0886; H01L 21/8221;
(Continued)

(56) References Cited

U.S. PATENT DOCUMENTS

| | | | |
|---|---|---|---|
| 2007/0259501 A1* | 11/2007 | Xiong | ............... H01L 21/845 438/283 |
| 2012/0126883 A1* | 5/2012 | Juengling | ......... H01L 27/0886 327/581 |

(Continued)

FOREIGN PATENT DOCUMENTS

| | | |
|---|---|---|
| KR | 1020130106091 A | 9/2013 |
| WO | 2016204755 A1 | 12/2016 |
| WO | 2019135766 A1 | 7/2019 |

OTHER PUBLICATIONS

International Search Report and Written Opinion received for PCT Application No. PCT/US2018/012734. dated Oct. 8, 2018. 10 pages.

(Continued)

*Primary Examiner* — Errol V Fernandes
*Assistant Examiner* — Jeremy J Joy
(74) *Attorney, Agent, or Firm* — Schwabe, Williamson & Wyatt, P.C.

(57) ABSTRACT

An integrated circuit structure includes: a top semiconductor fin extending in a length direction; a bottom semiconductor fin extending in the length direction, the bottom semiconductor fin being under and vertically aligned with the top semiconductor fin; a top gate structure in contact with a portion of the top semiconductor fin; top source and drain regions each adjacent to the portion of the top semiconductor fin; a bottom gate structure in contact with a portion of the bottom semiconductor fin; and bottom source and drain regions each adjacent to the portion of the bottom semiconductor fin. The portion of the top semiconductor fin is (Continued)

between the top source region and the top drain region. The portion of the bottom semiconductor fin is between the bottom source and drain regions. Heights, widths, or both the heights and widths of the portions of the top and bottom semiconductor fins are different.

20 Claims, 30 Drawing Sheets

(51) Int. Cl.

| | | |
|---|---|---|
| *H01L 27/088* | (2006.01) | |
| *H01L 27/092* | (2006.01) | |
| *H01L 27/12* | (2006.01) | |
| *H01L 29/06* | (2006.01) | |
| *H01L 29/66* | (2006.01) | |
| *H01L 29/775* | (2006.01) | |
| *H01L 29/786* | (2006.01) | |
| *H01L 21/822* | (2006.01) | |
| *H01L 21/8238* | (2006.01) | |
| *H01L 21/8234* | (2006.01) | |

(52) U.S. Cl.
CPC .. *H01L 21/823821* (2013.01); *H01L 25/0657* (2013.01); *H01L 27/0924* (2013.01); *H01L 27/1211* (2013.01); *H01L 29/0673* (2013.01); *H01L 29/775* (2013.01); *H01L 29/78696* (2013.01); *H01L 21/823431* (2013.01); *H01L 21/823842* (2013.01)

(58) Field of Classification Search
CPC ..... H01L 21/823431; H01L 21/823821; H01L 25/043; H01L 25/0657; H01L 25/074
See application file for complete search history.

(56) References Cited

U.S. PATENT DOCUMENTS

| | | | |
|---|---|---|---|
| 2013/0161694 A1* | 6/2013 | Adam | H01L 21/823821 257/192 |
| 2013/0244392 A1* | 9/2013 | Oh | H01L 29/0649 438/299 |
| 2013/0313610 A1* | 11/2013 | Sell | H01L 29/6656 257/192 |
| 2015/0187766 A1* | 7/2015 | Basker | H01L 29/66484 257/365 |
| 2015/0228722 A1* | 8/2015 | Chung | H01L 27/0886 257/401 |
| 2015/0279978 A1* | 10/2015 | Meiser | H01L 29/808 257/586 |
| 2015/0287648 A1* | 10/2015 | Cai | H01L 21/823821 257/369 |
| 2015/0311085 A1* | 10/2015 | Kozarsky | H01L 21/3086 257/401 |
| 2016/0005866 A1* | 1/2016 | Wu | H01L 29/0649 257/401 |
| 2016/0020109 A1* | 1/2016 | Yoo | H01L 29/66553 438/275 |
| 2016/0211264 A1* | 7/2016 | Peng | H01L 21/8221 |
| 2016/0211276 A1* | 7/2016 | Liu | H01L 27/1211 |
| 2016/0315085 A1* | 10/2016 | Choi | H01L 21/823807 |
| 2017/0117188 A1* | 4/2017 | Zhou | H01L 21/823821 |
| 2018/0204932 A1* | 7/2018 | Mehandru | H01L 27/0688 |
| 2019/0355756 A1* | 11/2019 | Nelson | H01L 21/823828 |

OTHER PUBLICATIONS

International Preliminary Report on Patentability dated Jul. 14, 2020 for International Patent Application PCT/US2018/012734, 6 pages.

* cited by examiner

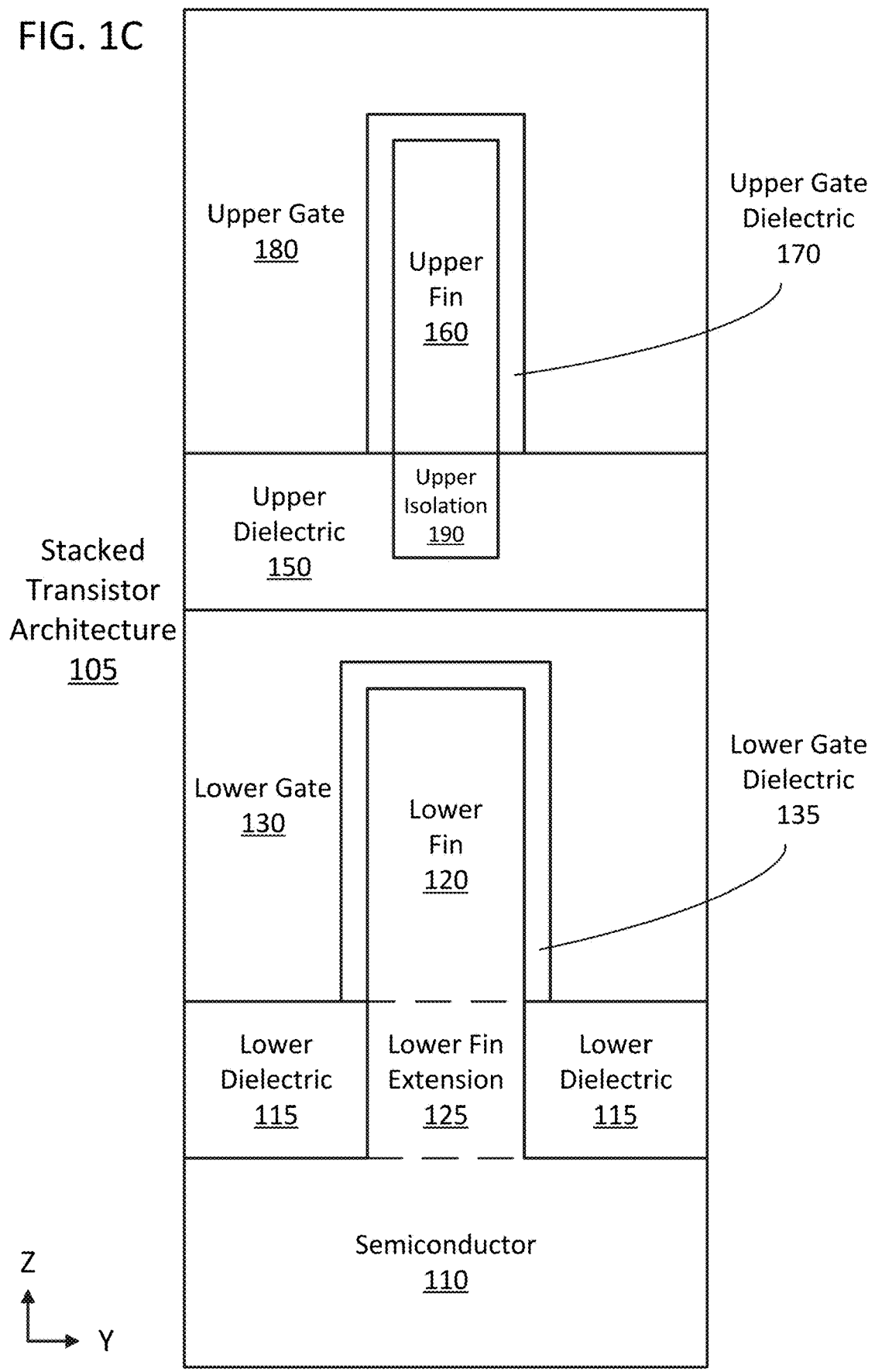

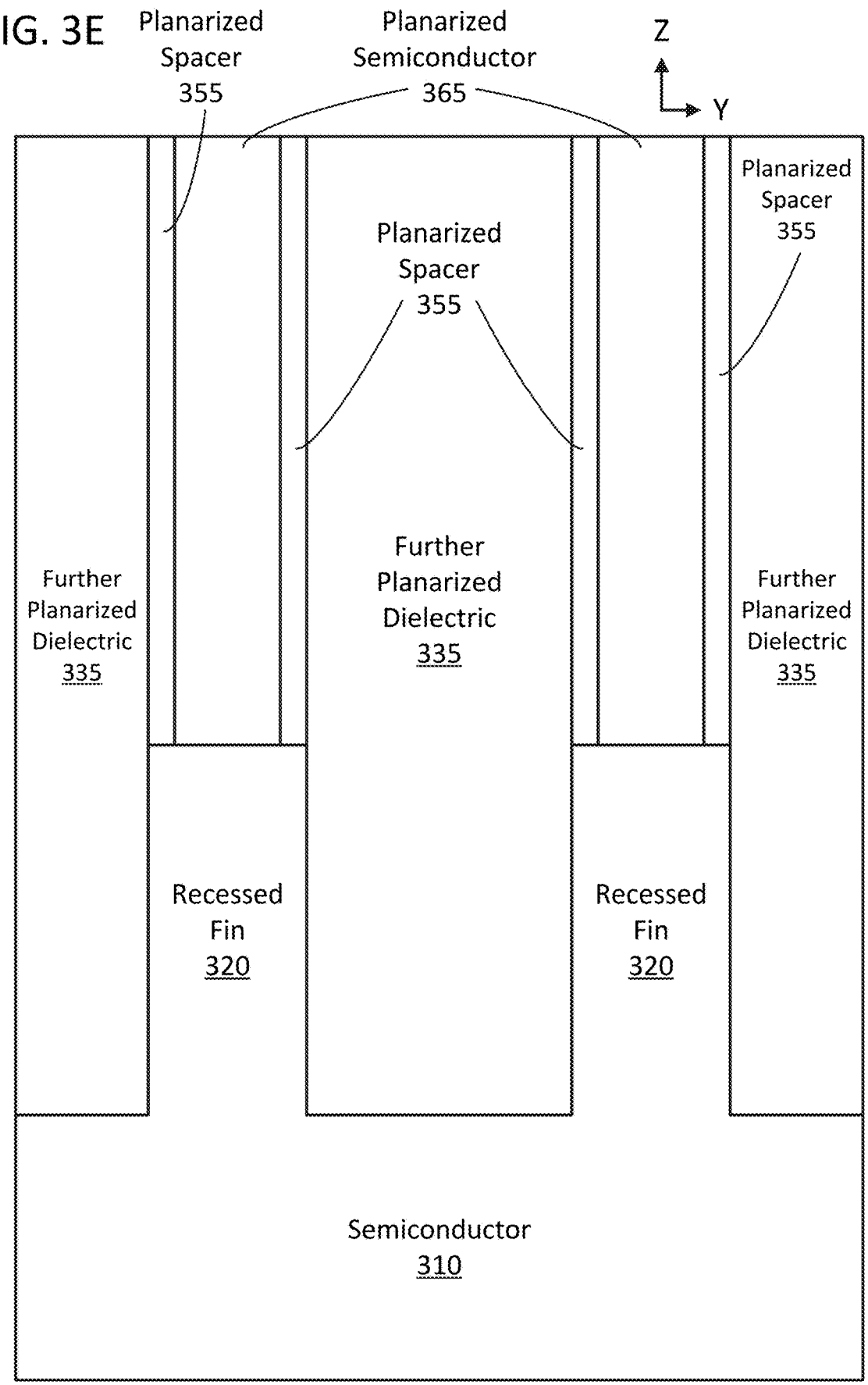

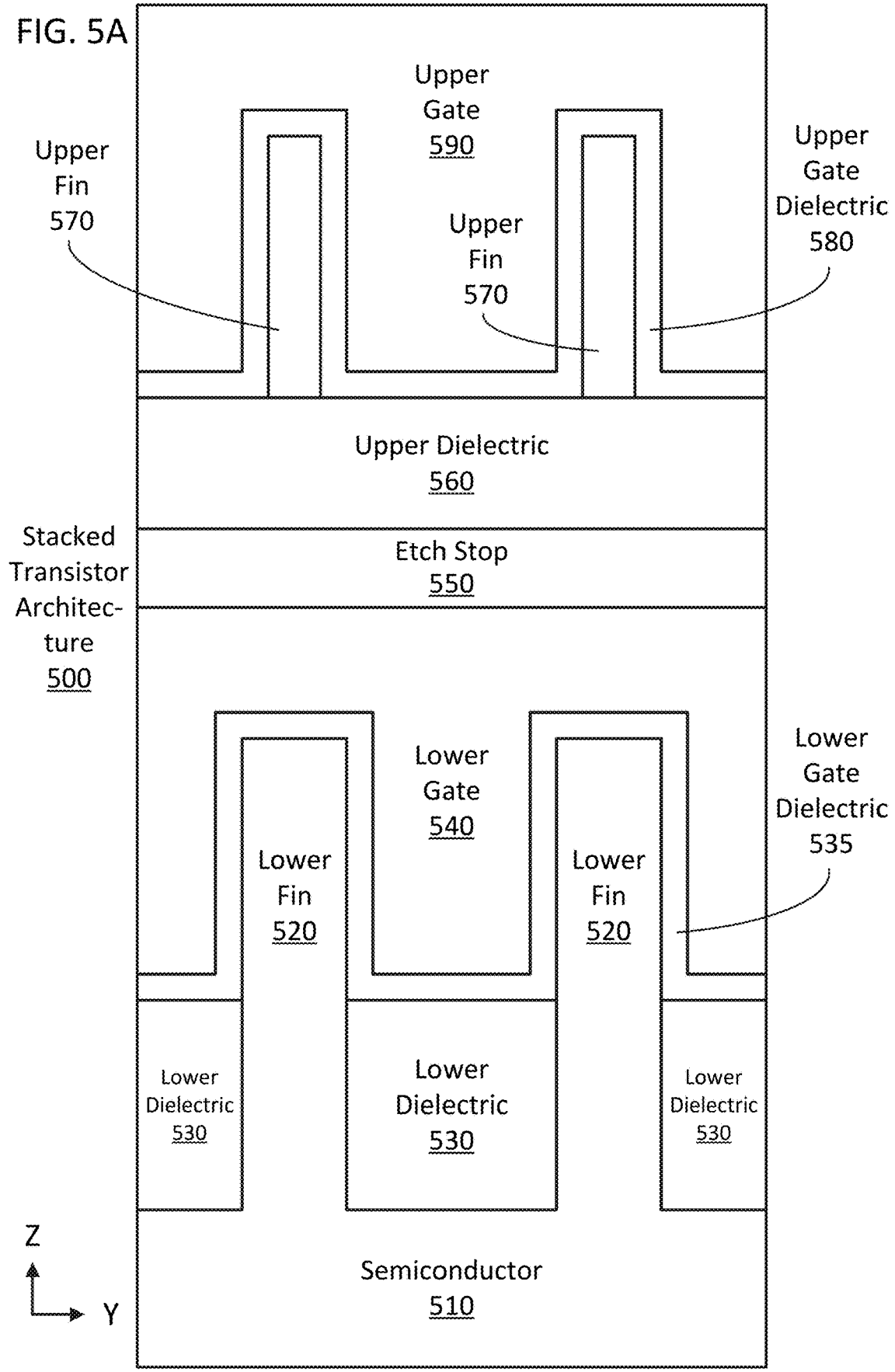

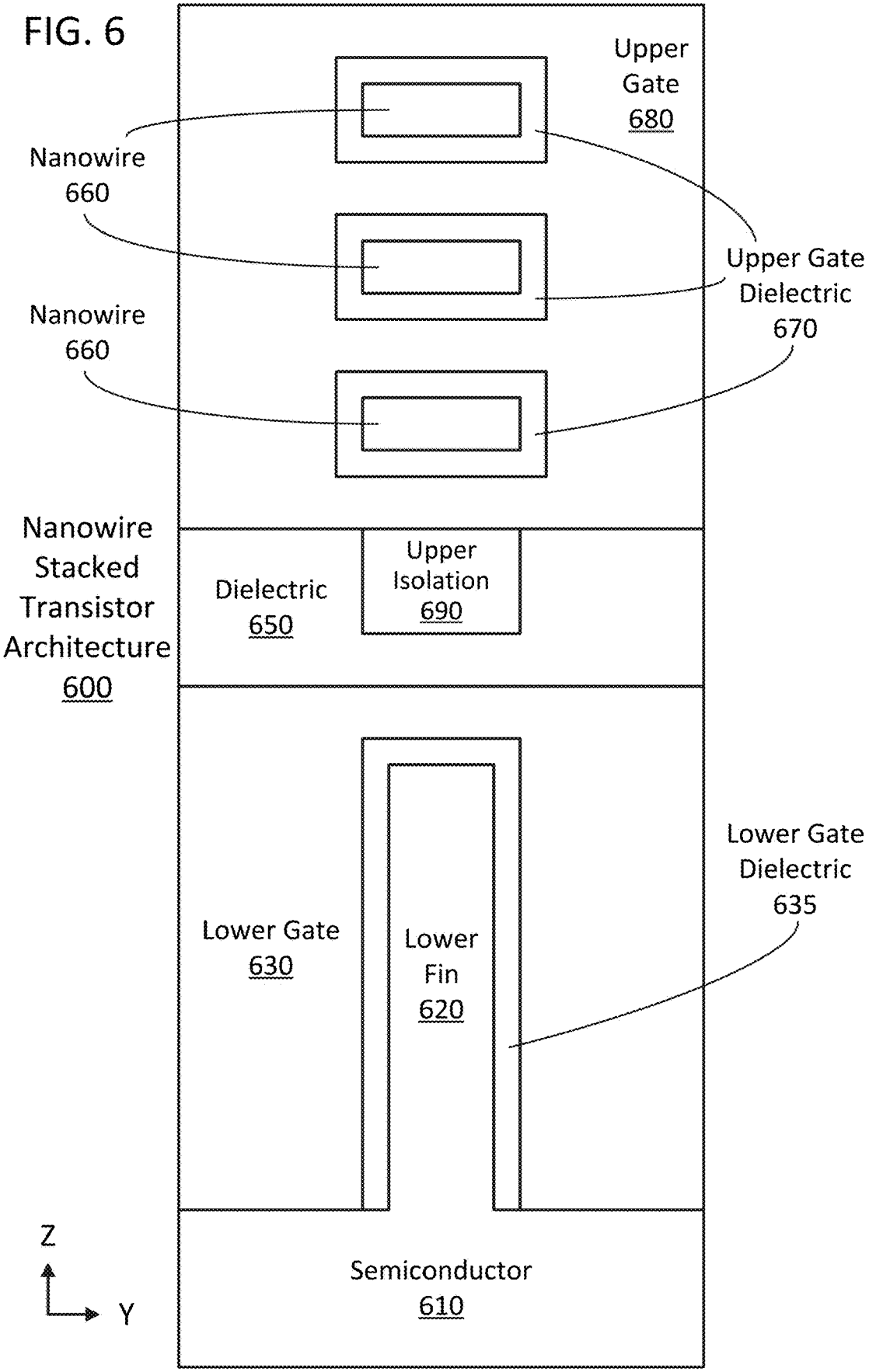

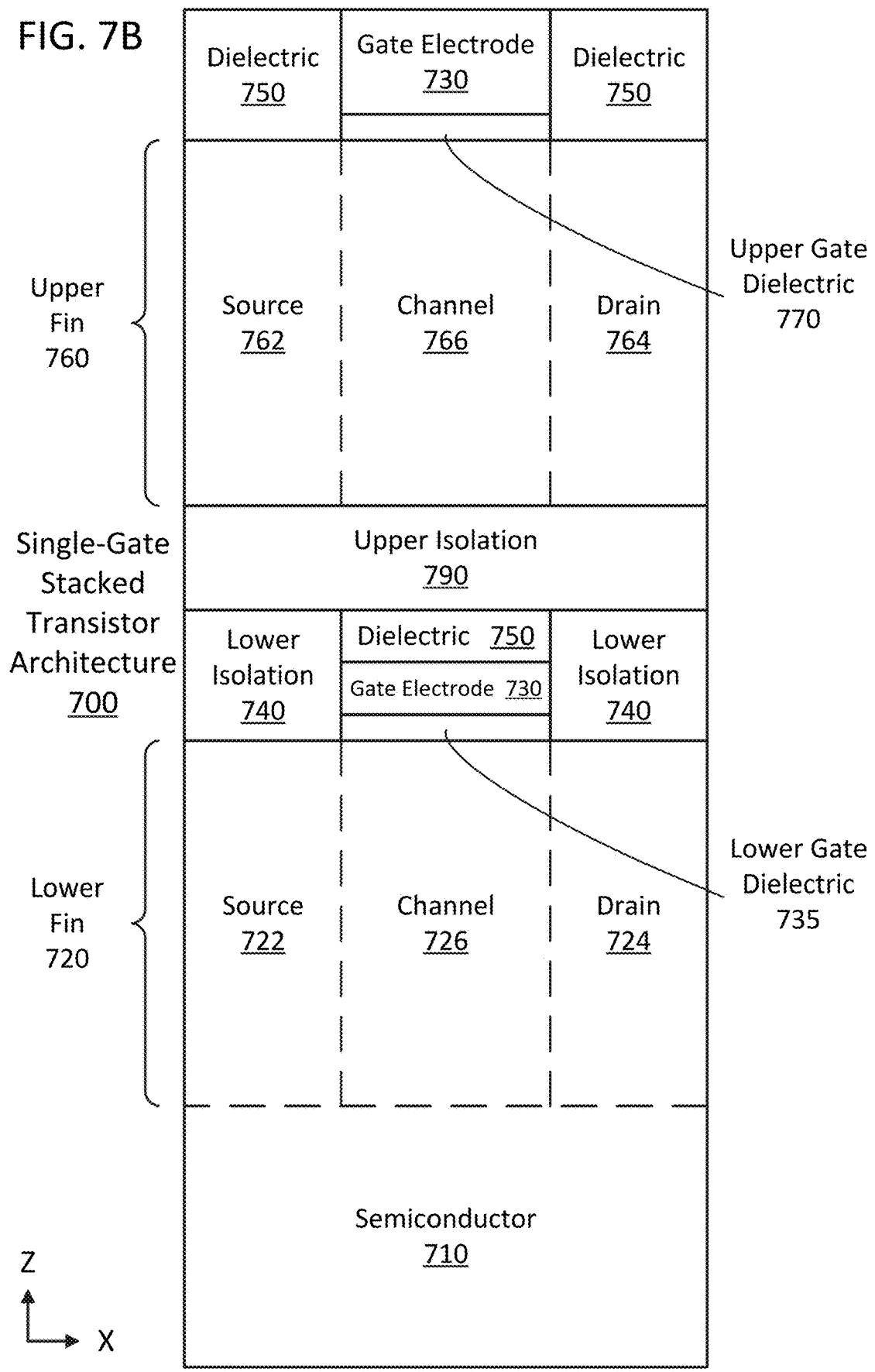

Method of Fabricating Integrated Circuit Structure 900

Start

↓

Form semiconductor fins extending in same length direction, each fin including lower portion and upper portion, the fins defining corresponding trenches between the fins extending in the same length direction
910

↓

Fill trenches with dielectric material
920

↓

Planarize dielectric material to expose top surfaces of upper portions of fins
930

↓

Remove upper portions of fins to expose top surfaces of lower portions of fins while leaving cavities in dielectric material whose shapes correspond to those of removed upper portions of fins
940

↓

Modify walls of cavities to alter widths of the cavities compared to widths of removed upper portions of fins
950

↓

Fill modified cavities with replacement semiconductor fin material to form new upper portions of fins having different widths than widths of removed upper portions of fins
960

↓

End

FIG. 9

Method of Fabricating Integrated Circuit Structure 1000

Start
↓

Form semiconductor fins extending in same length direction, each fin including lower portion and upper portion, the fins defining corresponding trenches between the fins extending in the same length direction
1010

↓

Fill trenches with dielectric material
1020

↓

Planarize dielectric material to expose top surfaces of upper portions of fins
1030

↓

Remove upper portions of dielectric material to expose upper portions of fins while leaving lower portions of fins covered by dielectric material
1040

↓

Remove surface portions of exposed upper portions of fins to decrease widths of the exposed upper portions of fins compared to widths of covered lower portions of fins
1050

↓
End

FIG. 10

Method of Fabricating Integrated Circuit Structure
1100

( Start )

↓

Form bottom fin layer having semiconductor bottom fins extending in same length direction
1110

↓

Form bottom transistor including semiconductor portion of one of the bottom fins, source and drain portions on different sides of and adjacent to the semiconductor portion, gate dielectric on the semiconductor portion, and gate electrode on the gate dielectric
1120

↓

Fill spaces in bottom fin layer with dielectric material and planarize the bottom fin layer
1130

↓

Bond semiconductor layer to planarized bottom fin layer with dielectric bonding layer
1140

↓

Form top fin layer by forming semiconductor top fins from semiconductor layer, the top fins extending in same length direction and being vertically aligned or consistently offset in width direction with bottom fins; width of semiconductor portion is different than width of top fins
1150

↓

( End )

FIG. 11

STACKED TRANSISTOR ARCHITECTURE HAVING DIVERSE FIN GEOMETRY

CROSS-REFERENCE TO RELATED APPLICATIONS

This patent application is a U.S. National Phase Application under 35 U.S.C. § 371 of International Application No. PCT/US2018/012734, filed on Jan. 8, 2018, the entire contents of which is hereby incorporated by reference herein.

BACKGROUND

Semiconductor fin architectures are being used as alternatives to other approaches such as thin-film transistors (TFTs) for scaling semiconductor devices such as transistors into denser packages. There are a number of non-trivial performance issues associated with semiconductor fin architectures.

BRIEF DESCRIPTION OF THE DRAWINGS

FIGS. 1C-1D are cross-sectional views of an example stacked transistor architecture, according to another embodiment of the present disclosure.

FIGS. 3A-3F are cross-sectional views of an example method of fabricating the stacked transistor architecture of FIGS. 1A-1B, according to another embodiment of the present disclosure.

FIGS. 5A-5B are cross-sectional views of example bonding and layer transfer implementations of stacked transistor architectures, according to embodiments of the present disclosure.

FIG. 6 is a cross-sectional view of an example nanowire stacked transistor architecture, according to an embodiment of the present disclosure.

FIGS. 7A-7B are cross-sectional views of an example single-gate stacked transistor architecture, according to an embodiment of the present disclosure.

FIGS. 9-11 are flow diagrams of example methods of fabricating integrated circuit structures, according to embodiments of the present disclosure.

Figure 1A:
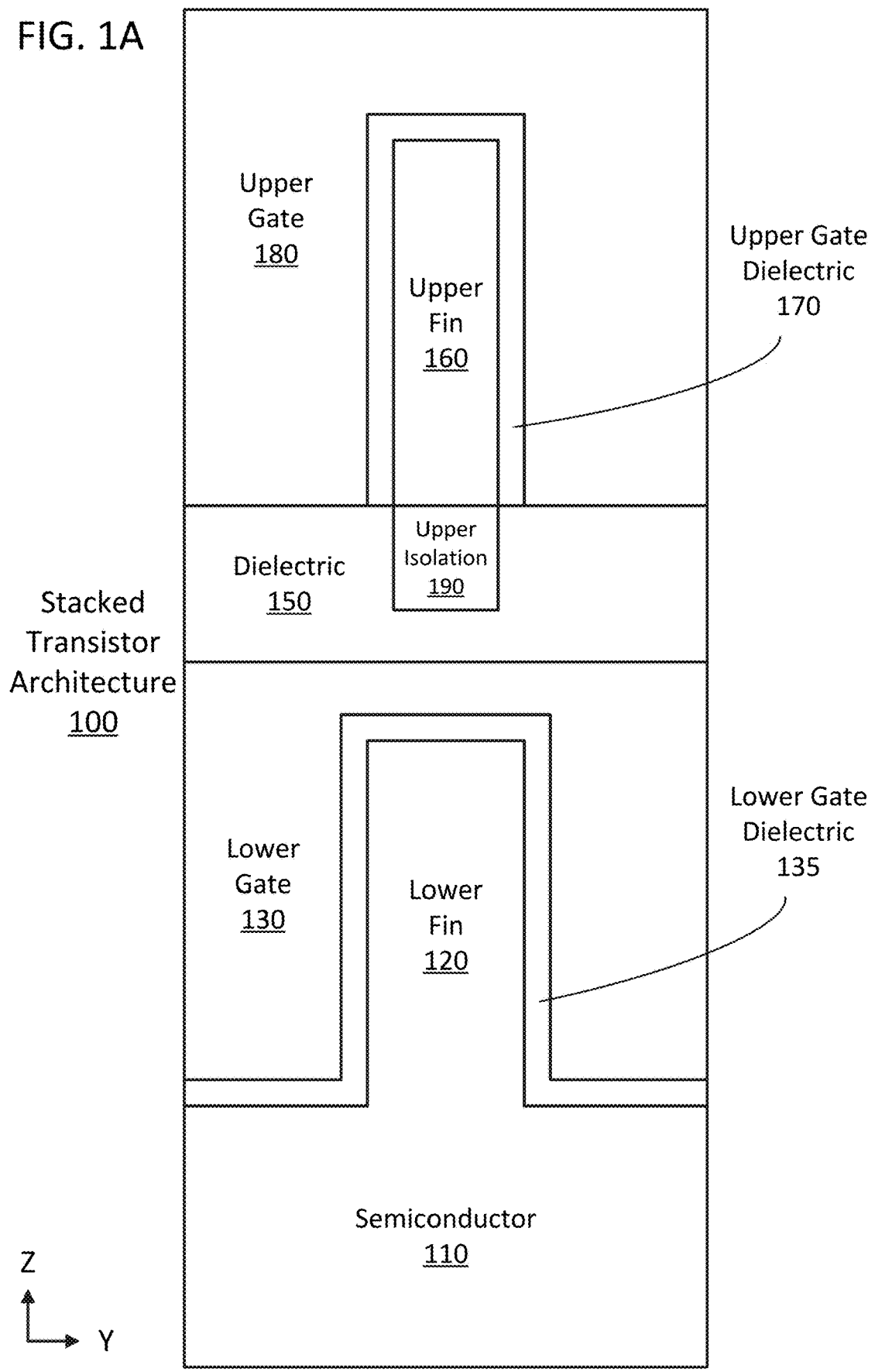
FIGS. 1A-1B are cross-sectional views of an example stacked transistor architecture, according to an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

According to various embodiments of the present disclosure, stacked transistor architectures having vertically aligned fins with diverse fin geometry are provided. In some embodiments, multiple fin widths are employed for different levels of fins. In some embodiments, multiple fin heights are employed for different levels of fins. For instance, different width fins at different vertical portions of stacked transistor architectures can provide improved characteristics such as improved electrical (e.g., propagation modes), thermal, yield, and mechanical characteristics. By way of example, different width fins for n-type metal oxide semiconductor (NMOS) devices versus p-type MOS (PMOS) devices can provide improved characteristics for complementary (CMOS) integrations in stacked device architectures (e.g., one fin width for NMOS devices for one level of the stack, and a different fin width for PMOS devices for another level of the stacked CMOS architecture). Electrical propagation modes can be improved in some CMOS configurations by using wider NMOS fins than CMOS fins. In some embodiments, there are more than two device layers in the stacked architecture. In some embodiments, the device layers include fin field-effect transistor (FinFET) devices and non-FinFET devices. In some embodiments, the device layers include integration of a nanoribbon or nanowire device layer with a FinFET device layer.

General Overview

As noted above, there are a number of non-trivial performance issues associated with semiconductor fin architectures or semiconductor fin field-effect transistor (FinFET) architectures. Stacking FinFET devices can increase the density (or area density) of such devices on an integrated circuit. Further, different device layers can benefit from different width fins in stacked device architectures. However, an example approach to monolithic stacking would use the same width on top and bottom device layers, to use the same front-end lithography and isolation processes.

Accordingly, in various embodiments of the present disclosure, different fin geometries (e.g., different fin widths, different fin heights, and the like) are employed at different layers of a stacked transistor architecture. In some embodiments, the fins are vertically aligned (such as originally formed from the same tall semiconductor fins) between device layers. In some embodiments, the fins are consistently offset (e.g., at the same pitch, or at pitches that are integer multiples or integer divisors of one another) between device layers. In some embodiments, aspect ratio trapping (ART), which epitaxially seeds one semiconductor layer off an existing seed layer and forms new semiconductor within a mold, is used to form a top fin that is narrower or wider than a bottom fin in a vertically stacked process. In some embodiments, a single lithographic operation is used to fabricate fins having different widths, for example, stacked transistor architectures such as nanowires on FinFETs. Here, the nanowires (or nanoribbons) fit in the width of a semiconductor fin (or replacement semiconductor fin) structure and can be treated as a form of semiconductor fin within this disclosure.

In some embodiments, a CMOS integration of a stacked transistor architecture is provided, with NMOS transistors in one device layer and PMOS transistors in another device layer. The NMOS transistors use one fin width while the PMOS transistors use a different fin width. For instance, in some embodiments, it is useful to have a slightly wider (e.g., 10% wider or more) fin for Group III-V (e.g., gallium arsenide) semiconductor materials than for Group IV (e.g., silicon, silicon germanium, and the like) semiconductor materials. In some of these embodiments, NMOS transistors use a wider Group III-V semiconductor fin layer than corresponding PMOS transistors in another device layer and implemented with a Group IV semiconductor. In some embodiments, a much wider second fin structure is utilized (e.g., 50% wider, 100% wider, or more), such as for nanowire or nanoribbon implementations (e.g., for NMOS fin structures). In some embodiments, a stacked CMOS transistor architecture is employed with a nanowire NMOS device layer and a FinFET PMOS device layer. Here, the NMOS nanowire width is significantly wider (e.g., twice as wide or more) as the PMOS FinFET fin width.

In an example embodiment of the present disclosure, an integrated circuit (IC) structure is provided. The IC structure includes a top semiconductor fin extending in a length direction, a bottom semiconductor fin extending in the length direction, a top gate structure in contact with a portion of the top semiconductor fin, a top source region and a top drain region each adjacent to the portion of the top semiconductor fin, a bottom gate structure in contact with a portion of the bottom semiconductor fin, and a bottom source region and a bottom drain region each adjacent to the portion of the bottom semiconductor fin. The bottom semiconductor fin is under and vertically aligned with the top semiconductor fin. The portion of the top semiconductor fin is between the top source region and the top drain region. The portion of the bottom semiconductor fin is between the bottom source region and the bottom drain region. Heights, widths, or both the heights and widths of the portions of the top and bottom semiconductor fins are different.

In another example embodiment of the present disclosure, a stacked transistor structure is provided. The stacked transistor structure includes a top set of two or more transistors having corresponding semiconductor fin structures extending in a length direction, and a bottom set of two or more transistors having corresponding semiconductor fin structures extending in the length direction. The top set includes a top transistor having a top semiconductor fin structure, and a source region and a drain region separated by and physically connected to a portion of the top semiconductor fin structure. The semiconductor fin structures in the bottom set are under and consistently offset in a width direction with the semiconductor fin structures of the top set. The bottom set includes a bottom transistor having a bottom semiconductor fin structure, and a source region and a drain region separated by and physically connected to a portion of the bottom semiconductor fin structure. A height, a width, or both the height and width of the portion of the top semiconductor fin structure is different from the height, width, or both the height and width of the bottom semiconductor fin structure.

Architecture and Methodology

Figure 1B:
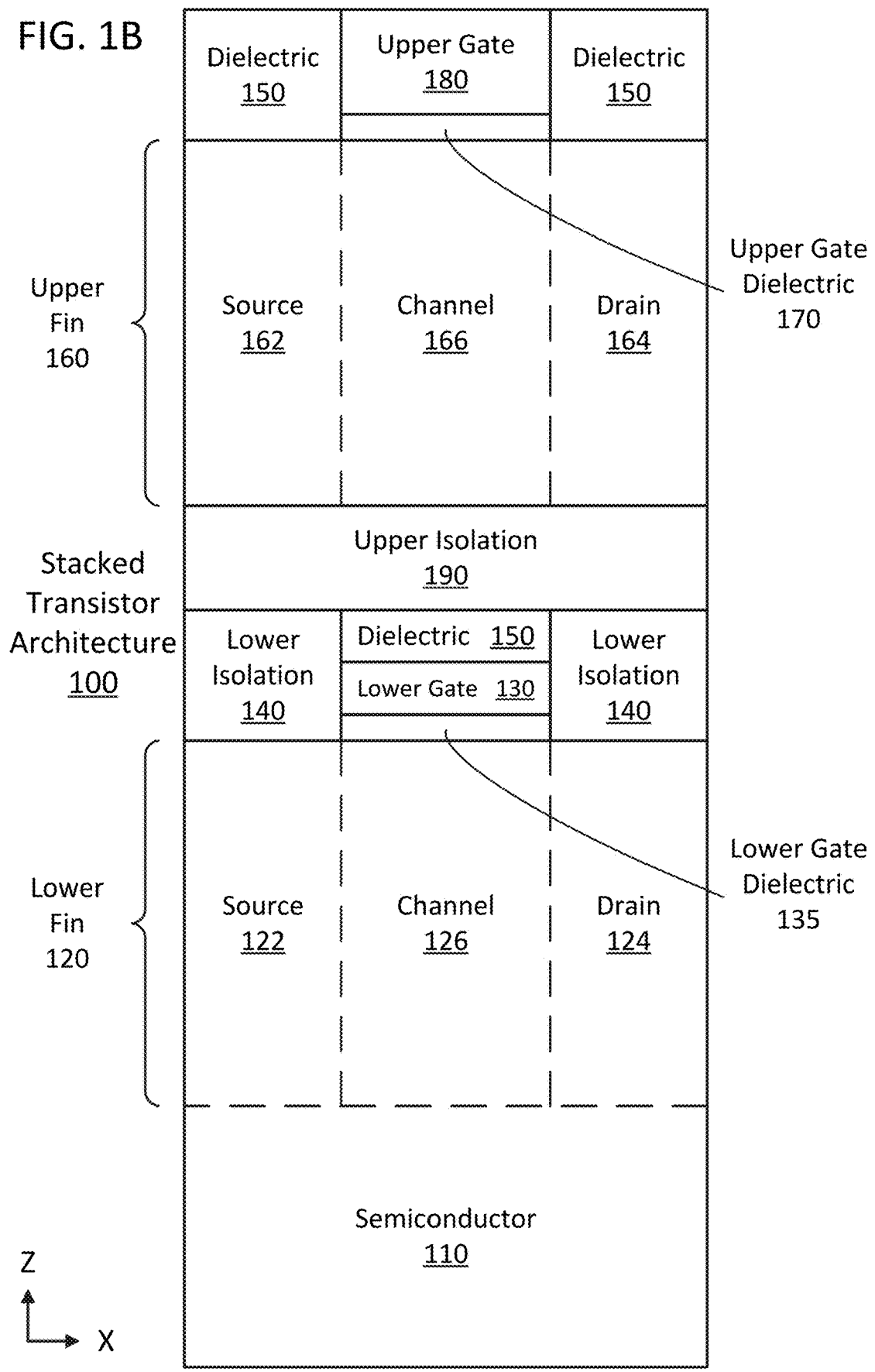

FIGS. 1A-1B are cross-sectional views of an example stacked transistor architecture 100 including upper and lower transistors, according to an embodiment of the present disclosure. In the stacked transistor architecture 100, FIG. 1A is a Y-Z view and FIG. 1B is an X-Z view, where X, Y, and Z represent the length, width, and height dimensions of the underlying semiconductor fins making up the stacked transistors. In more detail, FIG. 1A is a cross-sectional view through gate electrodes 180 and 130 of the upper and lower transistors, respectively, while FIG. 1B is a cross-sectional view through upper and lower fins 160 and 120 of the upper and lower transistors, respectively. The lower fin 120 is wider than the upper fin 160. For example, the lower fin 120 is 10% or more wider (e.g., 20%, 30%, or 50%) than the upper fin 160.

Here, width can be defined to be a suitable width based on factors such as the shape of the fin. For example, the width can be an average width, or a width at a consistent location (such as halfway up the fin in a vertical or height direction), or a transition width (e.g., width of the top portion of a lower fin and the bottom portion of an upper fin), or the like. Measurements like height (when comparing fin geometries) can be defined similarly. Dimensions like height and width can also be defined relative to the devices or device features being compared. For example, fin height can be the gate height, such as the vertical component corresponding to the overlap of the gate structure (e.g., gate electrode and gate dielectric) and the fin.

It should be noted that while most of the description herein is directed to stacked transistor architectures having two device layers (e.g., an upper device layer and a lower device layer), some other embodiments of the present disclosure are directed to stacked transistor architectures of three or more device layers. For example, in some embodiments, there are three or more device layers in a stacked transistor architecture, where the fin widths of the corresponding devices of two or more of the device layers are different. It should further be noted that while most of the description is directed to rectangular shape fins, other embodiments are not so limited. For instance, in other embodiments, the fins can be different shapes, such as trapezoidal or rounded shape, and the techniques disclosed herein still apply.

Referring to FIGS. 1A-1B, semiconductor 110, such as silicon (Si), silicon germanium (SiGe), or a Group III-V semiconductor such as gallium arsenide (GaAs) is formed into vertical fins, such as lower fin 120 and upper fin 160. In some embodiments, the lower fin 120 and upper fin 160 are at one time part of the same vertical fin extending from semiconductor 110. At some point in the fabrication, one or both of these fin structures may be replaced with a different fin structure using the original fin shape as a guide or template for forming the replacement fin or fins. For example, in some embodiments, the upper fin 160 includes replacement semiconductor fin material different than the semiconductor fin material of the lower fin 120. The lower fin 120 is covered with a lower gate dielectric 135, such as a high-K dielectric like hafnium dioxide ($HfO_2$). In a similar fashion, the upper fin 160 is covered with an upper gate dielectric 170 such as $HfO_2$ (for example, the same gate dielectric material as the lower gate dielectric 135). The lower gate dielectric 135 is covered with a lower gate electrode 130, such as one or more of a metal, conductive oxide, heavily doped semiconductor, and the like. Likewise, the upper gate dielectric 170 is covered with an upper gate electrode 180, such as one or more of a metal, conductive oxide, heavily doped semiconductor, and the like.

The lower and upper gate electrodes 130 and 180 control the lower and upper transistors, respectively, by applying gate voltages to semiconductive channel regions 126 and 166 of the lower and upper transistors. The lower and upper gate electrodes 130 and 180 can be the same composition or different (e.g., different metal, different dopant type, or the like). The channel regions 126 and 166 electrically connect source and drain regions 122 and 124 (of the lower transistor) and source and drain regions 162 and 164 (of the upper transistor) in response to the applied gate electrode voltage. The source and drain regions 122 and 124 (and 162 and 164) can be, for example, heavily doped regions of the lower fin 120 and upper fin 160. For instance, n-type source and drain regions can be semiconductor material heavily doped with n-type dopant, while p-type source and drain regions can be semiconductor material heavily doped with p-type dopant. In some embodiments, the source and drain regions 122 and 124 (and 162 and 164) are replacement semiconductor material, such as epitaxially formed source and drain regions with in situ doping.

The upper transistors of the stacked transistor architecture 100 are usually electrically isolated (or not in direct contact) from the lower transistors. By way of example, an insulating dielectric 150 such as silicon dioxide ($SiO_2$) covers the lower gate electrode 130 to electrically separate the lower gate electrode 130 from the upper gate electrode 180. In addition, lower isolation layer 140 and upper isolation layer 190 also electrically separate the lower and upper transistors (such as the source and drain regions 122 and 124 of the lower transistor from the source and drain regions 162 and 164 of the upper transistor). The lower isolation layer 140 covers the lower source and drain regions 122 and 124 of the lower fin 120 while the upper isolation layer 190 is below the upper fin 160 and above the lower isolation layer 140 and the insulating dielectric 150 covering the lower gate electrode 130. The lower and upper isolation layers 140 and 190 correspond to the semiconductor fin (e.g., formed originally from the same tall semiconductor fin), such as between and vertically aligned with the lower fin 120 and upper fin 160.

For example, the lower and upper isolation layers 140 and 190 can be doped semiconductor. For instance, if the upper transistor is an NMOS device, then the upper isolation layer 190 can be p-doped semiconductor, and if the upper transistor is a PMOS device, then the upper isolation layer 190 can be n-doped semiconductor. Likewise, if the lower transistor is an NMOS device, then the lower isolation layer 140 can be p-doped semiconductor, and if the lower transistor is a PMOS device, then the lower isolation layer 140 can be n-doped semiconductor. In some embodiments, the lower and upper isolation layers 140 and 190 are formed through oxidation or removal of a portion of the fin between the lower and upper fins 120 and 160. In some embodiments, the lower and upper isolations layers 140 and 190 are formed through fixed charge layers adjacent to the fin (such as fixed charge layers adjacent to the lower and upper isolation layers 140 and 190). Remaining spaces can be filled with further insulating dielectric 150 such as $SiO_2$.

Figure 1D:
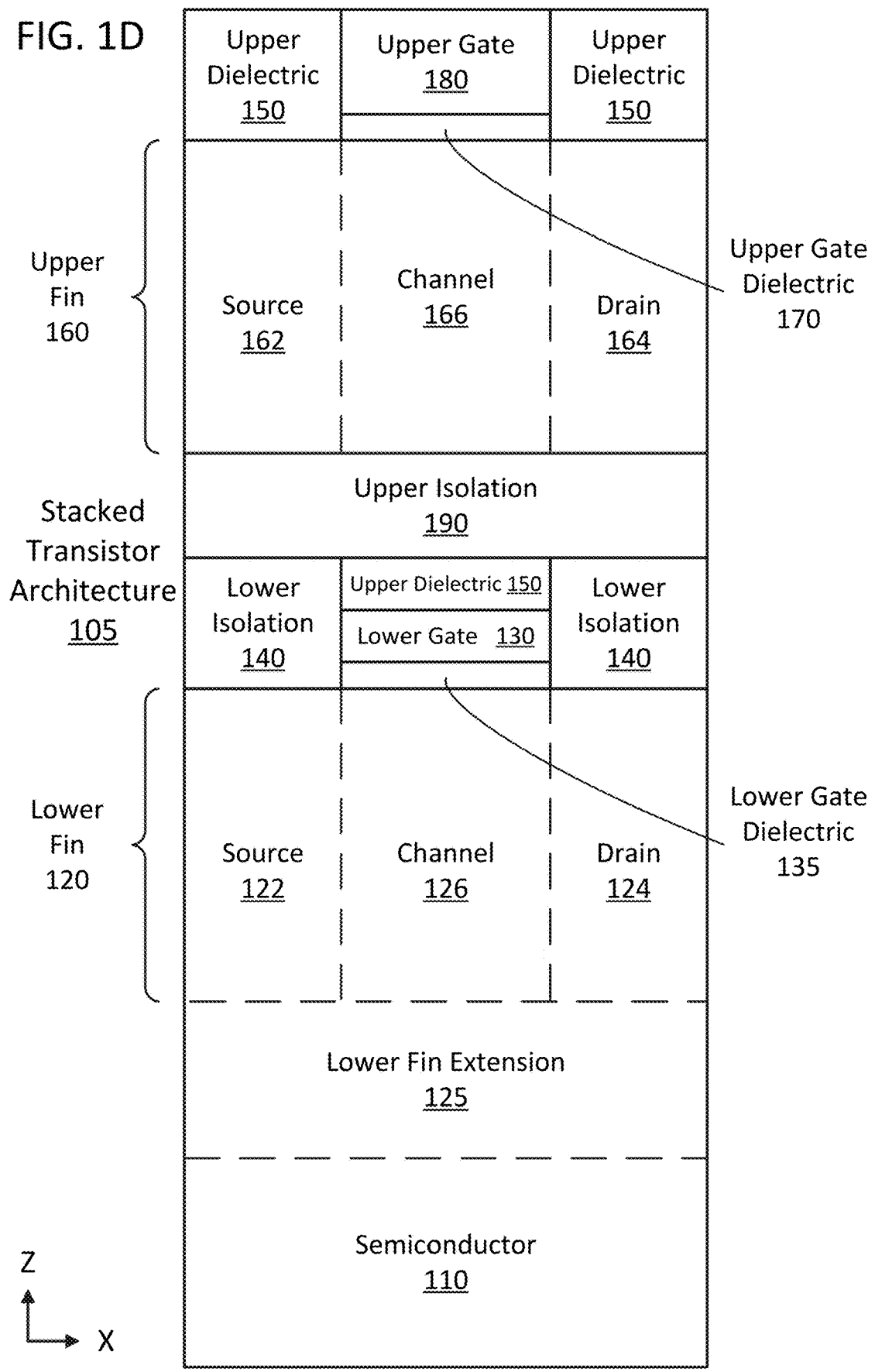

FIGS. 1C-1D are cross-sectional views of an example stacked transistor architecture 105, according to another embodiment of the present disclosure. The stacked transistor architecture 105 of FIGS. 1C-1D is similar to the stacked transistor architecture 100 of FIGS. 1A-1B, with corresponding elements between FIGS. 1C-1D and FIGS. 1A-1B being numbered the same and their corresponding descriptions not necessarily being repeated.

In the stacked transistor architecture 105, the lower gate structure (e.g., lower gate 130 and lower gate dielectric 135) does not extend down to the semiconductor 110. Rather, the semiconductor 110 (and possibly the lower gate dielectric 135) are polished (or selectively or anisotropically etched) to extend the lower fin 120 (exposing lower fin extension 125). The trench areas corresponding to the lower fin extension 125 are filled with a lower dielectric 115 (such as a shallow trench fill or shallow trench isolation), which can be, for example, an insulating oxide such as $SiO_2$ (or a nitride, oxynitride, or other insulating material). The lower gate electrode 130 is formed on the lower dielectric 115 and remaining lower gate dielectric 135. It should be noted that the dielectric 150 in FIGS. 1A-1B is renamed as upper dielectric 150 in FIGS. 1C-1D.

Features of the above embodiments may be combined or selectively appear in other embodiments. For example, features such as the fin extension, the covering of non-fin areas with the gate dielectric (or removal of the gate dielectric from the non-fin areas), the forming of the shallow trench fill (or other dielectric corresponding to the fin extension), to name a few, can appear in different combinations in different embodiments. For instance, the embodiments in FIGS. 6-8 described below can be modified to incorporate or remove features (and produce other embodiments) in this manner.

By way of example, in some embodiments, the lower gate dielectric 135 can be polished or etched away to expose the lower semiconductor 110 (e.g., the backside of the semiconductor 110), and the lower gate electrode 130 formed on the backside of the semiconductor 110 (e.g., contacting the semiconductor 110). See, for instance, FIG. 6 for one such embodiment. By way of another example, in some embodiments, the shallow trench fill or lower dielectric 115 can be formed between lower fins 120, and the gate structures formed on the lower dielectric 115. This effectively forms a lower fin extension 125 without further etching or polishing of the semiconductor 110 as discussed above. It should be noted that, in different embodiments, the dielectric materials for the lower dielectric 115, (upper) dielectric 150, and upper isolation 190 may be the same or different.

FIGS. 2A-2F are cross-sectional views of an example method of fabricating the stacked transistor architecture 100 of FIGS. 1A-1B, according to an embodiment of the present disclosure. The method of FIGS. 2A-2F highlights the formation of the different width fins (such as lower and upper fins 120 and 160) in the stacked transistor architecture 100 of FIGS. 1A-1B. For instance, in FIG. 2A, semiconductor 210 has tall, narrow fins 220 formed on top of it (e.g., through photolithography, epitaxial growth, or similar technique), with corresponding trenches between (and defined by) adjacent fins 220. The fins 220, for example, can be made of the same semiconductor material as semiconductor 210, and be of a uniform or consistent width or shape. It is desired to use the fins 220 to form a stacked transistor architecture, with the upper portions of the fins 220 having a smaller width than the lower portions of the fins 220.

Figure 2A:
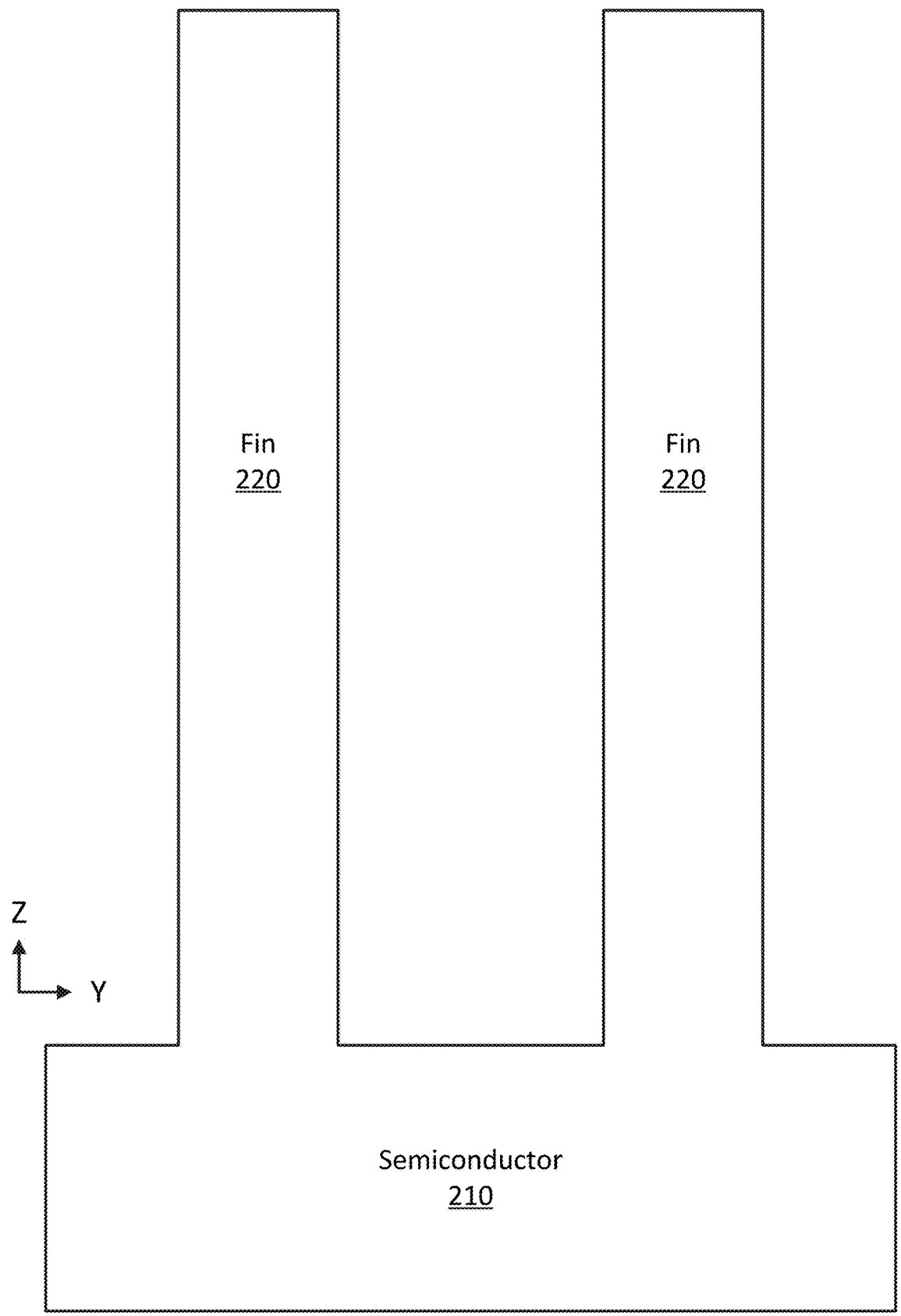
FIGS. 2A-2F are cross-sectional views of an example method of fabricating the stacked transistor architecture of FIGS. 1A-1B, according to an embodiment of the present disclosure.
Figure 2B:
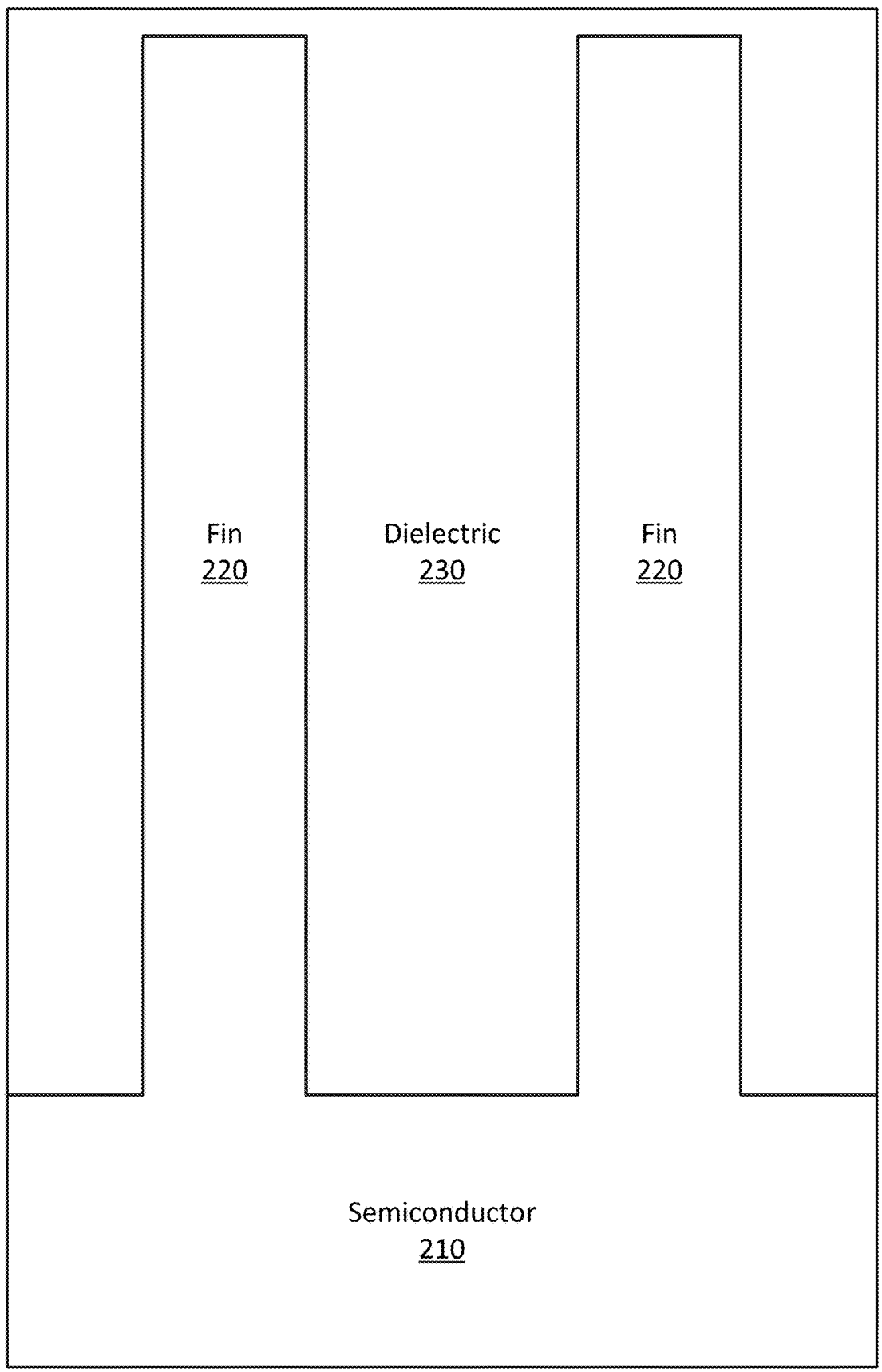
Figure 2C:
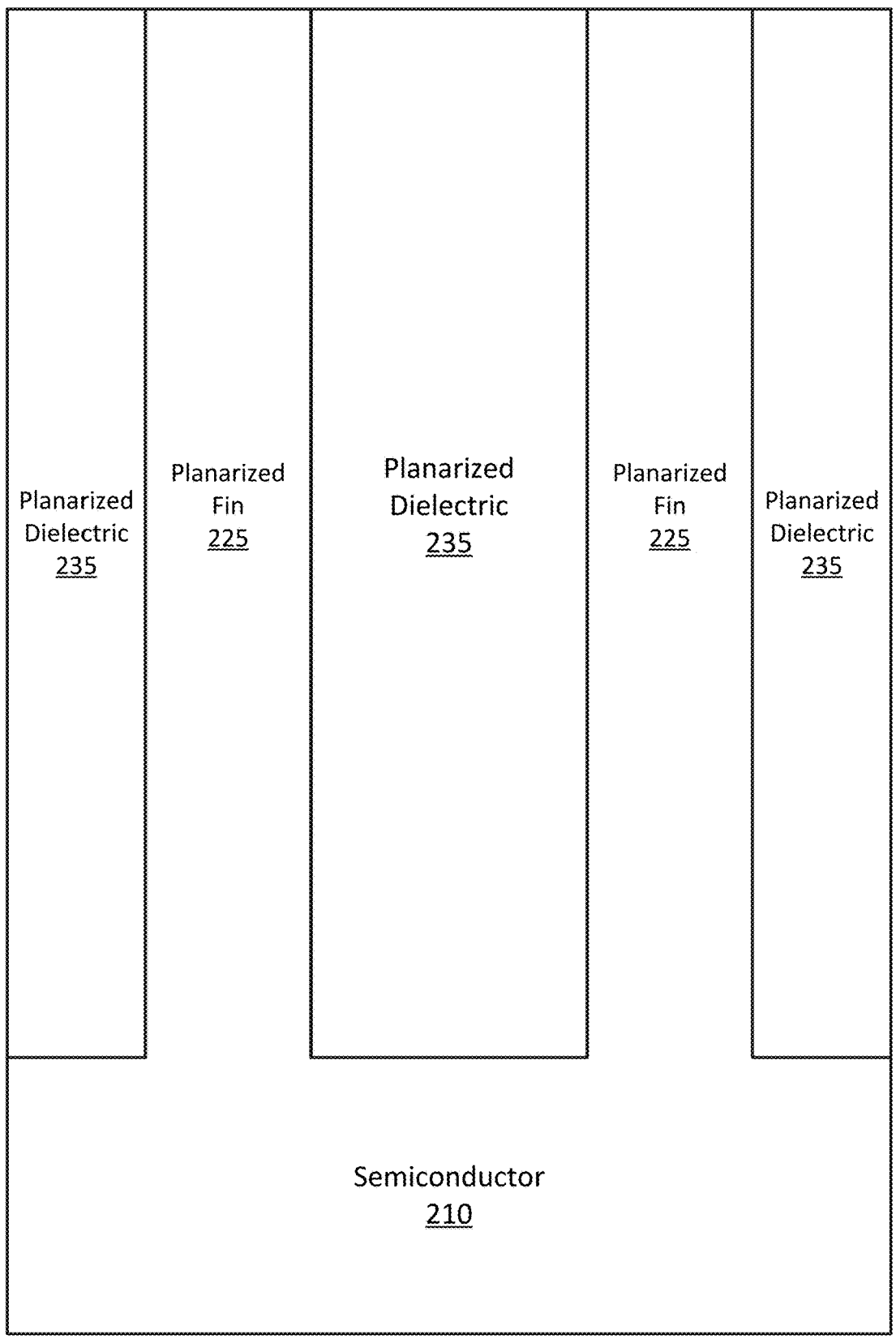
Figure 2D:
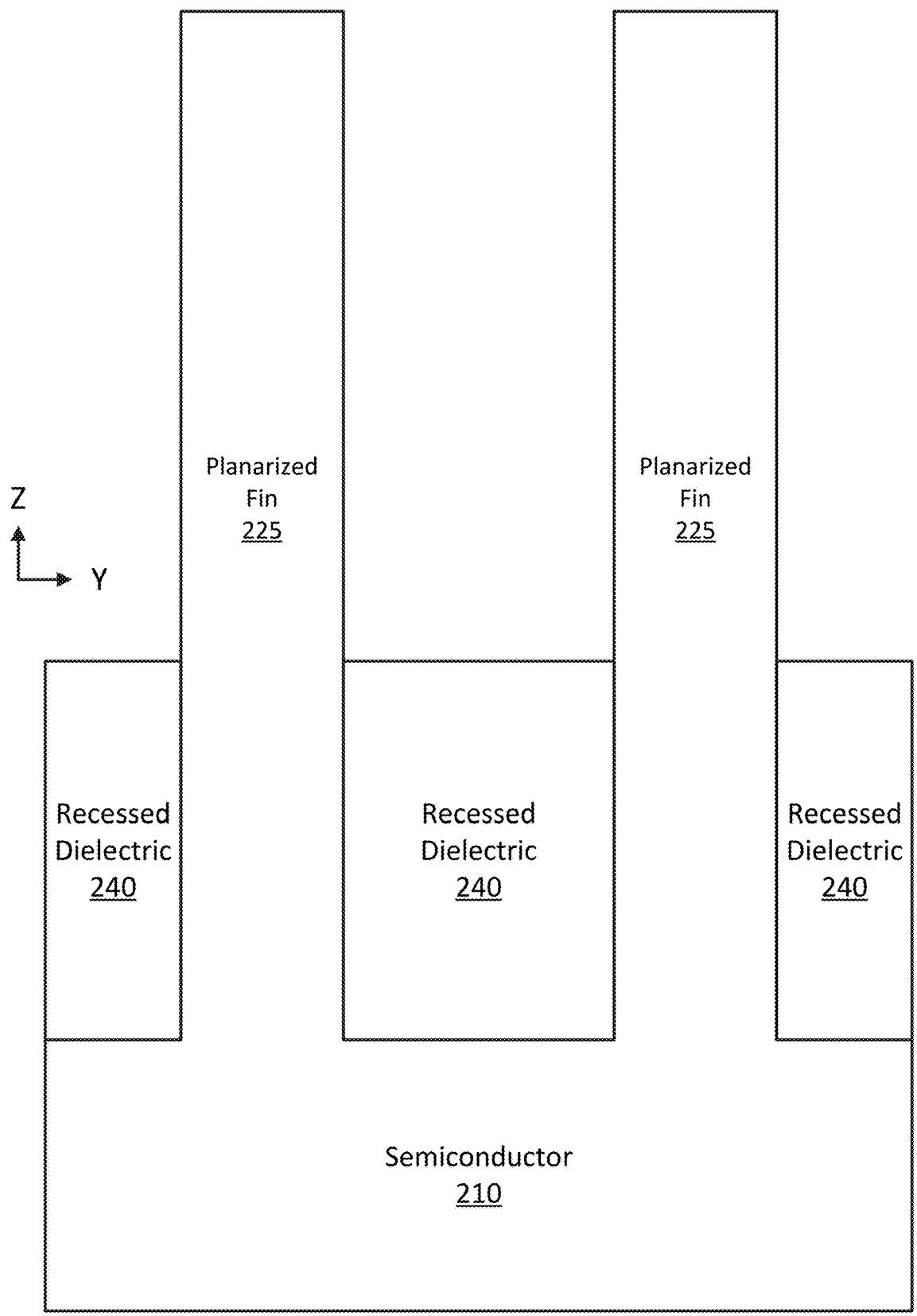
Figure 2E:
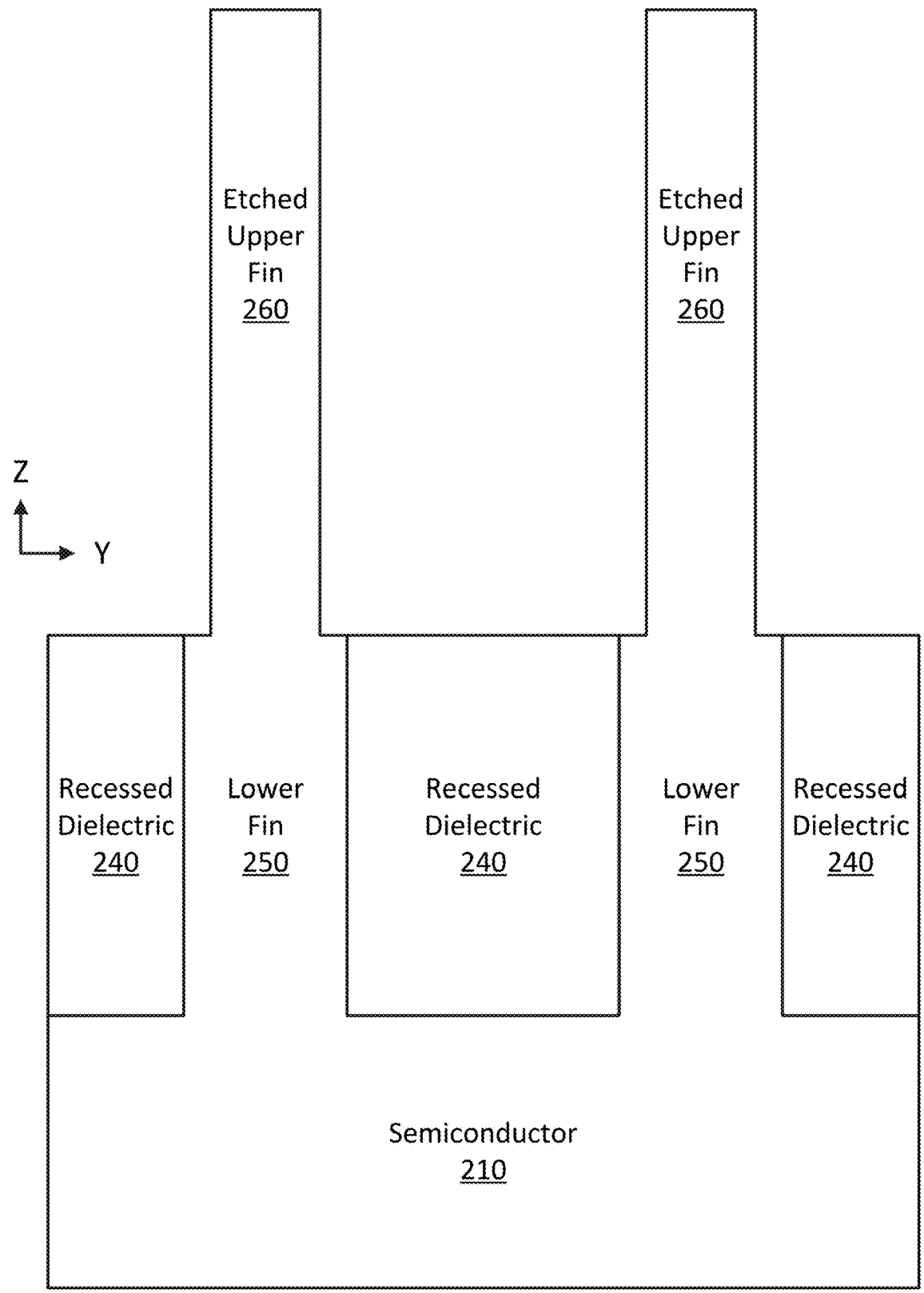
Figure 2F:
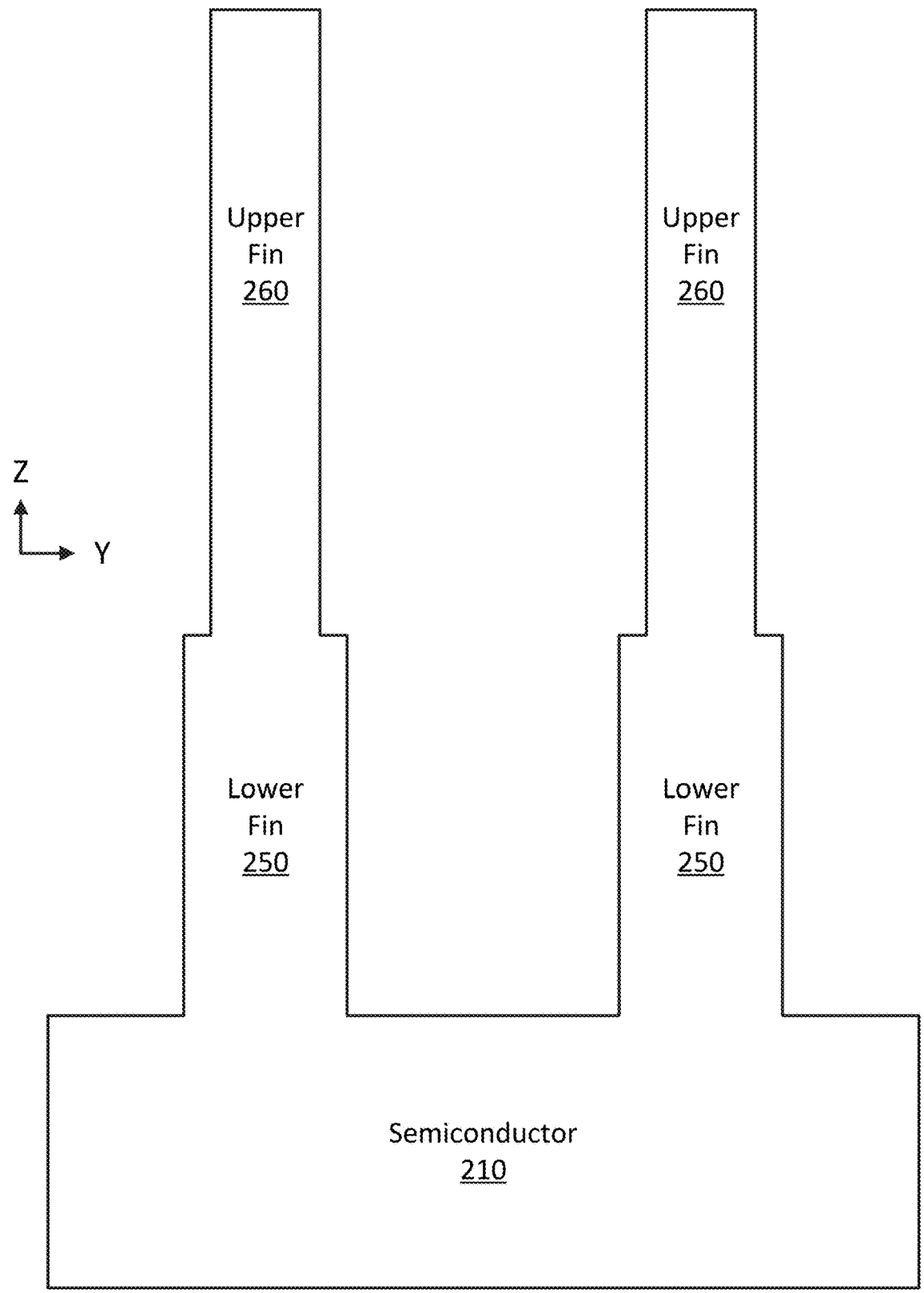

In FIG. 2B, dielectric material 230 (such as $SiO_2$, silicon oxynitride, silicon nitride, or the like) is used to fill the trenches and cover the fins 220. In FIG. 2C, the excess dielectric material 230 is planarized (e.g., through chemical-mechanical planarization or similar technique) or otherwise removed to produce planarized fins 225 and dielectric material 235. In some embodiments, this operation is omitted. In FIG. 2D, the planarized dielectric material 235 is recessed (e.g., through a timed etch) to produce recessed dielectric material 240 corresponding to the desired height of the lower fins and leaving the upper portions of the planarized fins 225 exposed. In FIG. 2E, the upper (exposed) portions of the planarized fins 225 are selectively etched while leaving the lower (covered) portions of the planarized fins 225 alone, producing etched (narrowed) upper fins 260 and leaving (normal width) lower fins 250. For example, the selective etching can be a digital etch, such as a (shallow) plasma oxidation of the exposed upper portion of the planarized fins 225 followed by a selective oxide removal of the oxidized surface material. In other embodiments, the selective etching can be a wet etch or similar process to remove only a (controlled) portion of the upper (exposed) part of the planarized fins 225. In FIG. 2F, the remaining recessed dielectric material 240 is removed to reveal the upper fins 260 having smaller widths than the lower fins 250.

Figure 3A:
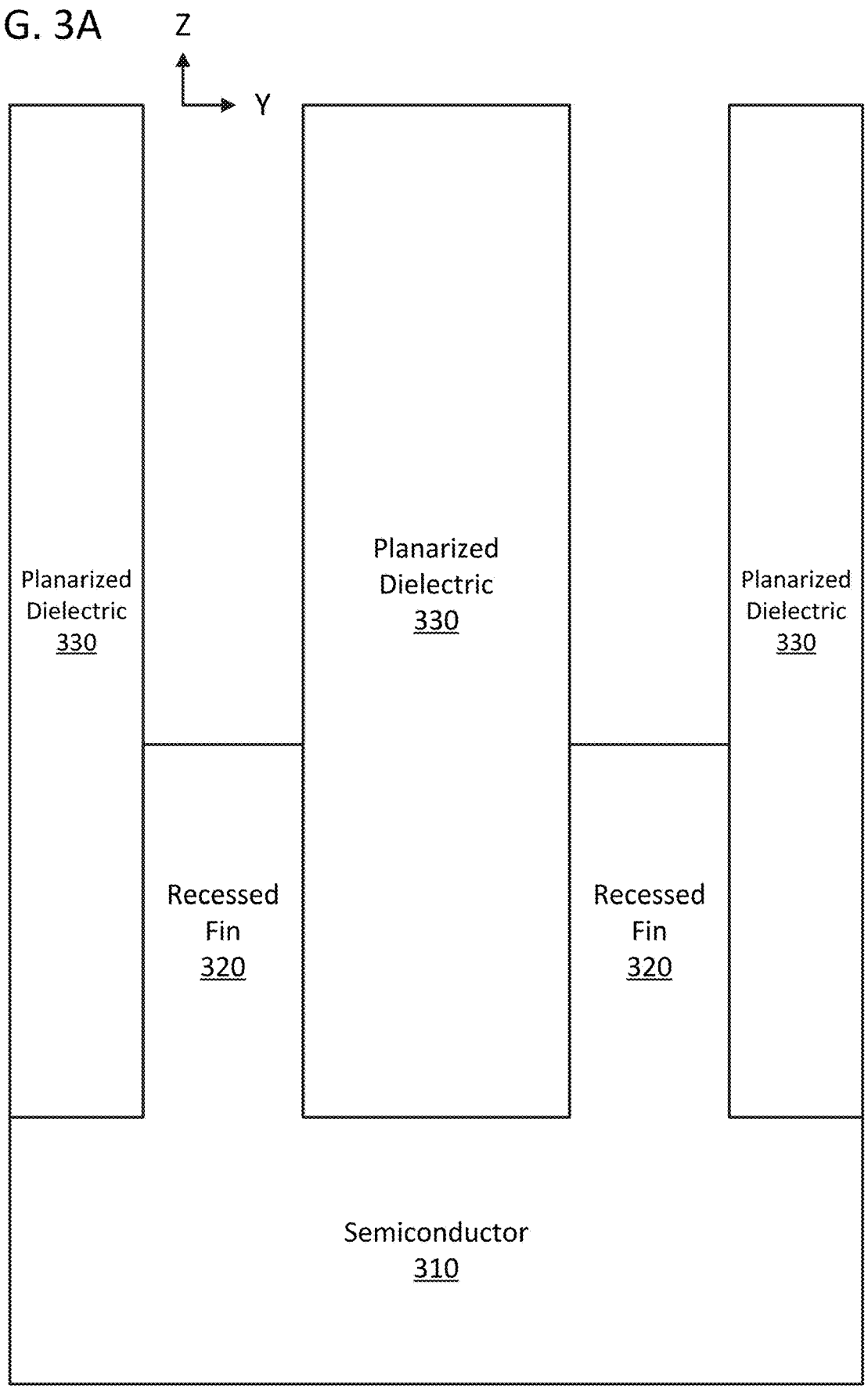
Figure 3B:
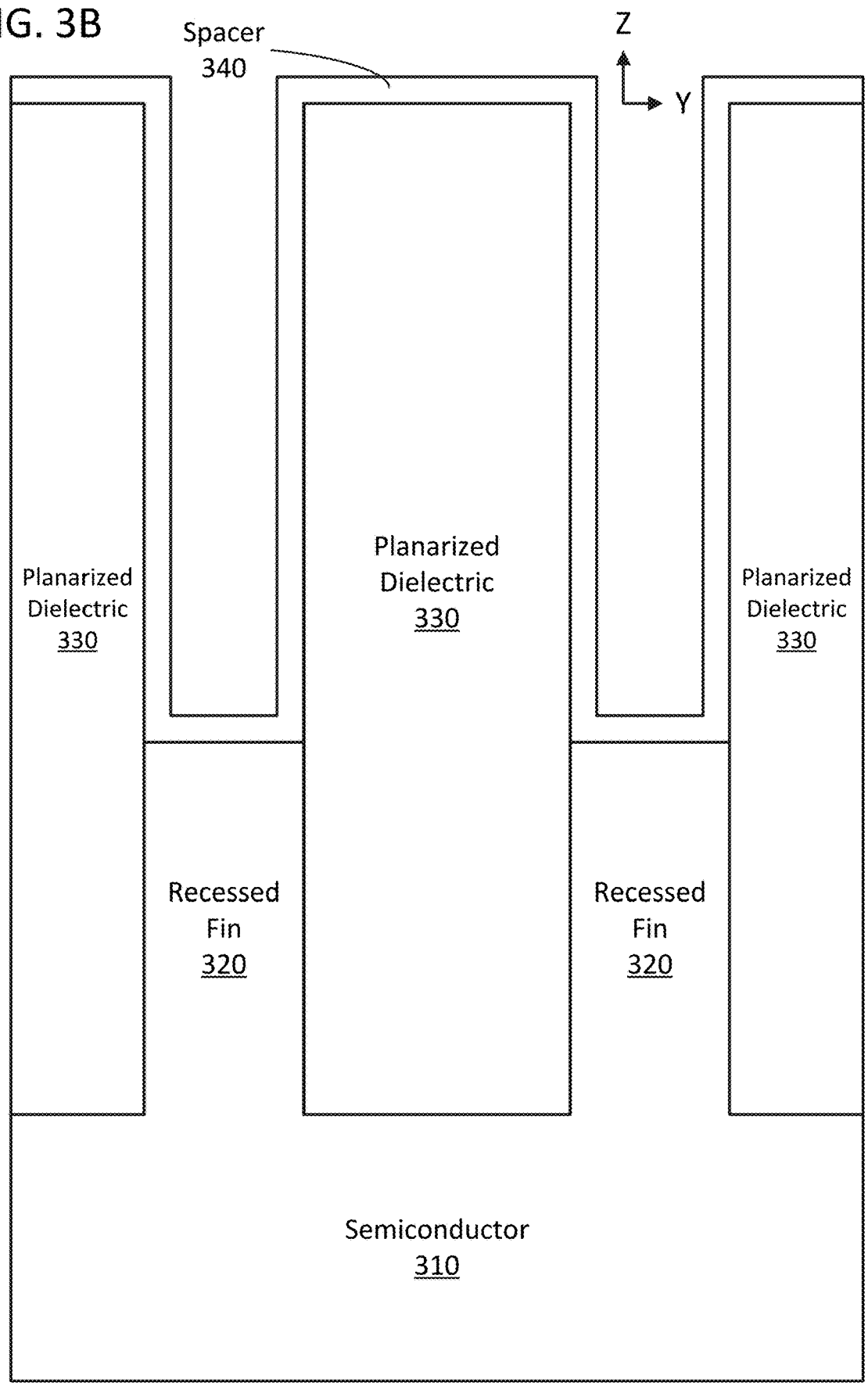
Figure 3C:
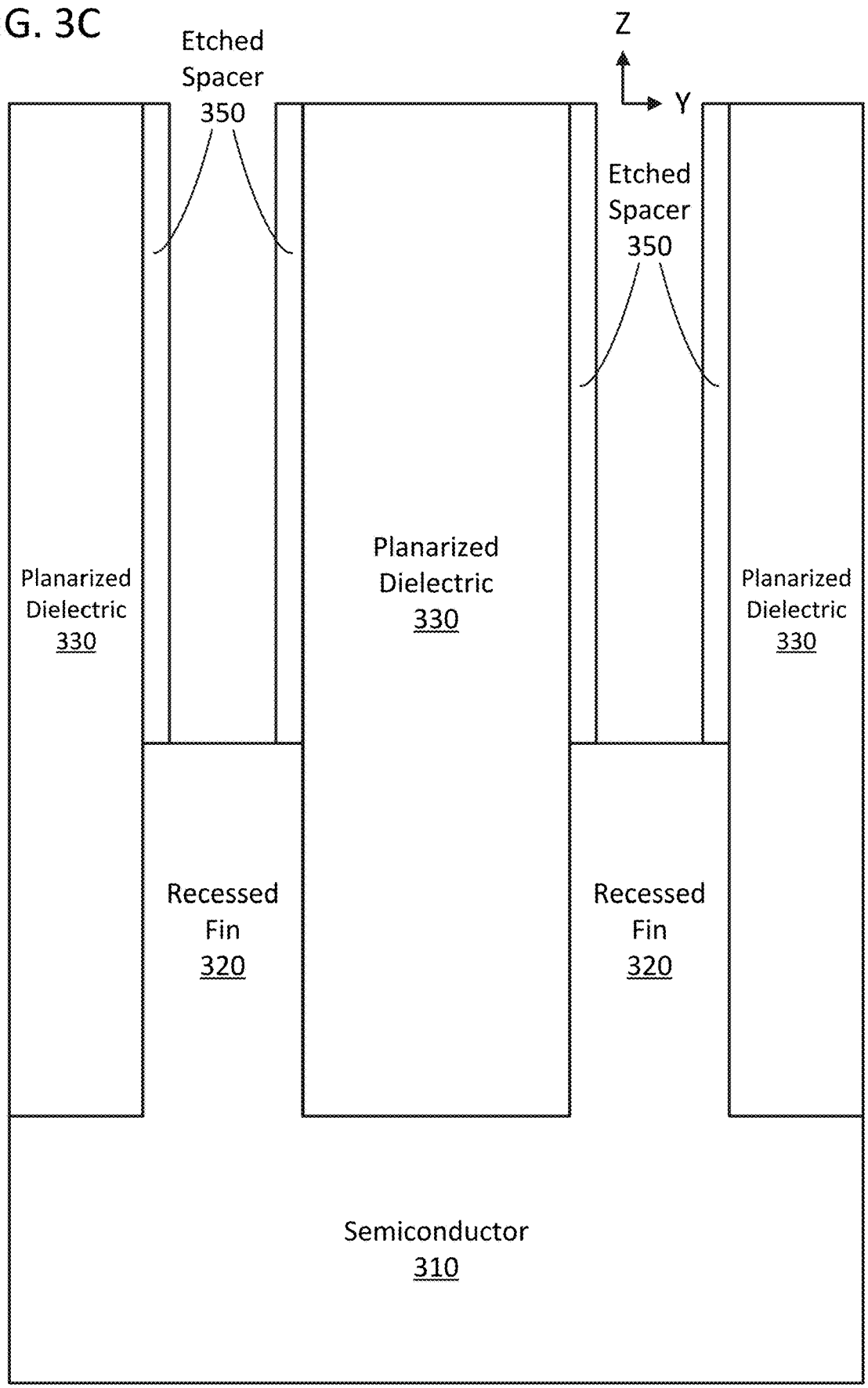

FIGS. 3A-3F are cross-sectional views of an example method of fabricating the stacked transistor architecture 100 of FIGS. 1A-1B, according to another embodiment of the present disclosure. In FIG. 3A, similar operations leading to the embodiment of FIG. 2C are performed, only this time followed by a selective etch to recess the planarized fin (instead of to recess the planarized dielectric as in FIG. 2D) to produce recessed fins 320 and leaving the planarized dielectric 330 in place. For example, the planarized fin can be recessed to the intended height of the lower fins. In FIG. 3B, a spacer 340 is formed on top of the planarized dielectric 330 and recessed fins 320. For example, an isotropic deposition such as atomic layer deposition (ALD) or the like can be used to deposit a very thin (e.g., a few nanometers (nm) thick, such as 2 or 3 nm) layer of spacer material (e.g., a nitride or other material chemically different than the dielectric or fin material). In FIG. 3C, the horizontal portions of the spacer 340 are removed by, for example, an anisotropic etch such as dry etching or plasma etching to form etched spacers 350 within (e.g., lining the walls of) the evacuated fins. The lined evacuated fins are also referred to as molds (for epitaxial growth).

Figure 3D:
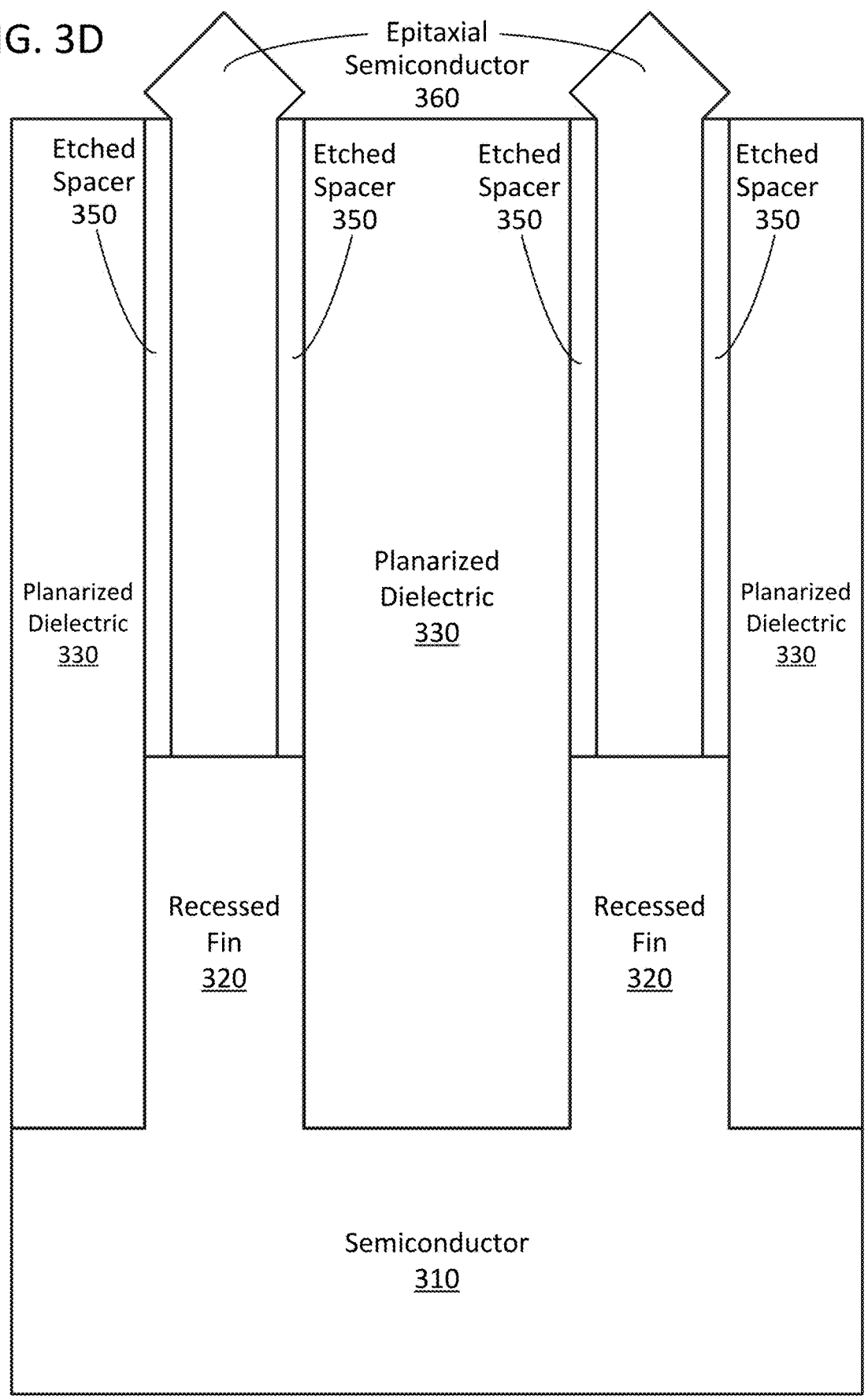

In FIG. 3D, epitaxial semiconductor 360 is grown (e.g., templated growth) within the molds (and extending slightly past the top of the molds), using the semiconductor material 310 present at the top of the recessed fins 320 to serve as seed crystals (e.g., the template). From these seed crystals, a second (different) semiconductor can be grown epitaxially, such as by using aspect ratio trapping (ART) within the molds. ART traps defects between the two semiconductor crystal structures using high aspect ratio features such as these molds, allowing the second semiconductor to grow without defects throughout most of the mold.

For example, the base semiconductor 310 can be silicon (Si) and the epitaxial semiconductor 360 can be germanium (Ge) or a III-V semiconductor such as GaAs. The ART technique allows the crystal mismatch between the two different semiconductors to be corrected within the mold (or other high aspect ratio feature) at locations near the interface of the two semiconductors (such as within 10% of the vertical height of the feature or mold). Such crystal defects at the interface will be apparent under high magnification (such as with electron microscopy) when using techniques such as ART. In FIG. 3E, the top surface of the molds is planarized to produce further planarized dielectric material 335, planarized spacers 355, and planarized semiconductor 365.

Figure 3F:
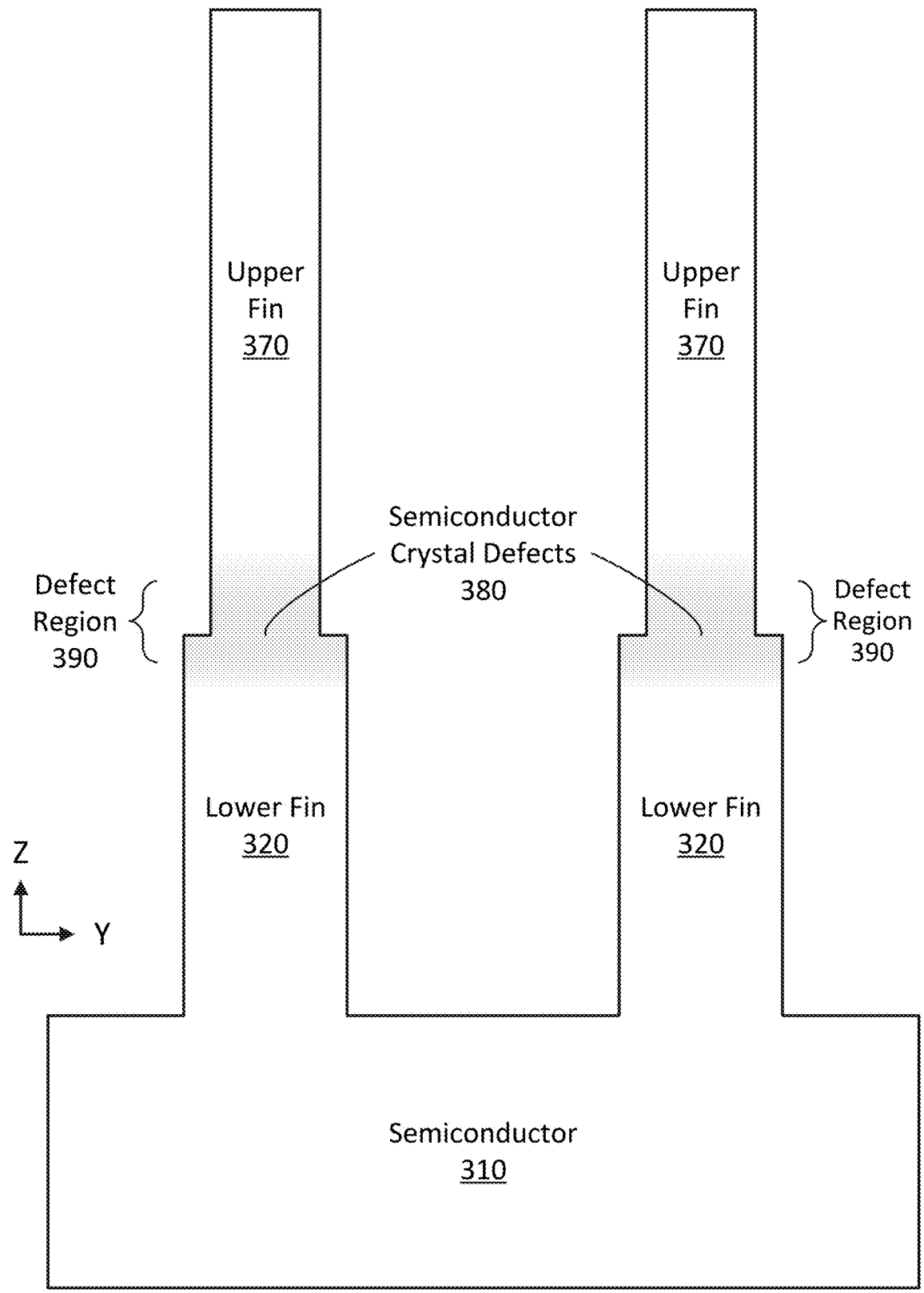

In FIG. 3F, the further planarized dielectric material 335 and the planarized spacers 355 are removed (e.g., through selecting etching) to reveal upper fins 370 and lower fins 320, with the lower fins 320 being wider than the upper fins 370. Here, the upper fins 370 can be a different semiconductor than the lower fins 320. When using techniques such as ART, different semiconductors will form crystal defects 380 at the boundaries between the lower fins 320 and the upper fins 370. While the density of defects 380 will be greatest at the boundary, they can still be found at distances (such as 10% of the feature height) away from the boundary, such as in a defect region 390. For example, if the upper fins 370 extend 200 nm in height, the defects 380 may be contained in the bottom 20 nm of the upper fins 370, while if the lower fins 320 are 100 nm tall, the defects 380 may be contained in the top 10 nm of the lower fins 320 (accordingly, the defect region 390 may be 30 nm tall). The defects 380 are due to crystal mismatches between the two semiconductors, but gradually correct themselves as the ART process extends up the feature (trapping such defects near the semiconductor boundaries and eventually producing the proper crystal structure for most of the feature height).

The technique of FIGS. 3A-3F can also be performed using the same semiconductor for the lower and upper fins 320 and 370. In this case, there will not be crystal mismatches or defects at the interface since it is the same material, but the upper fins 370 will still be smaller in width than the lower fins 320.

Figure 4A:
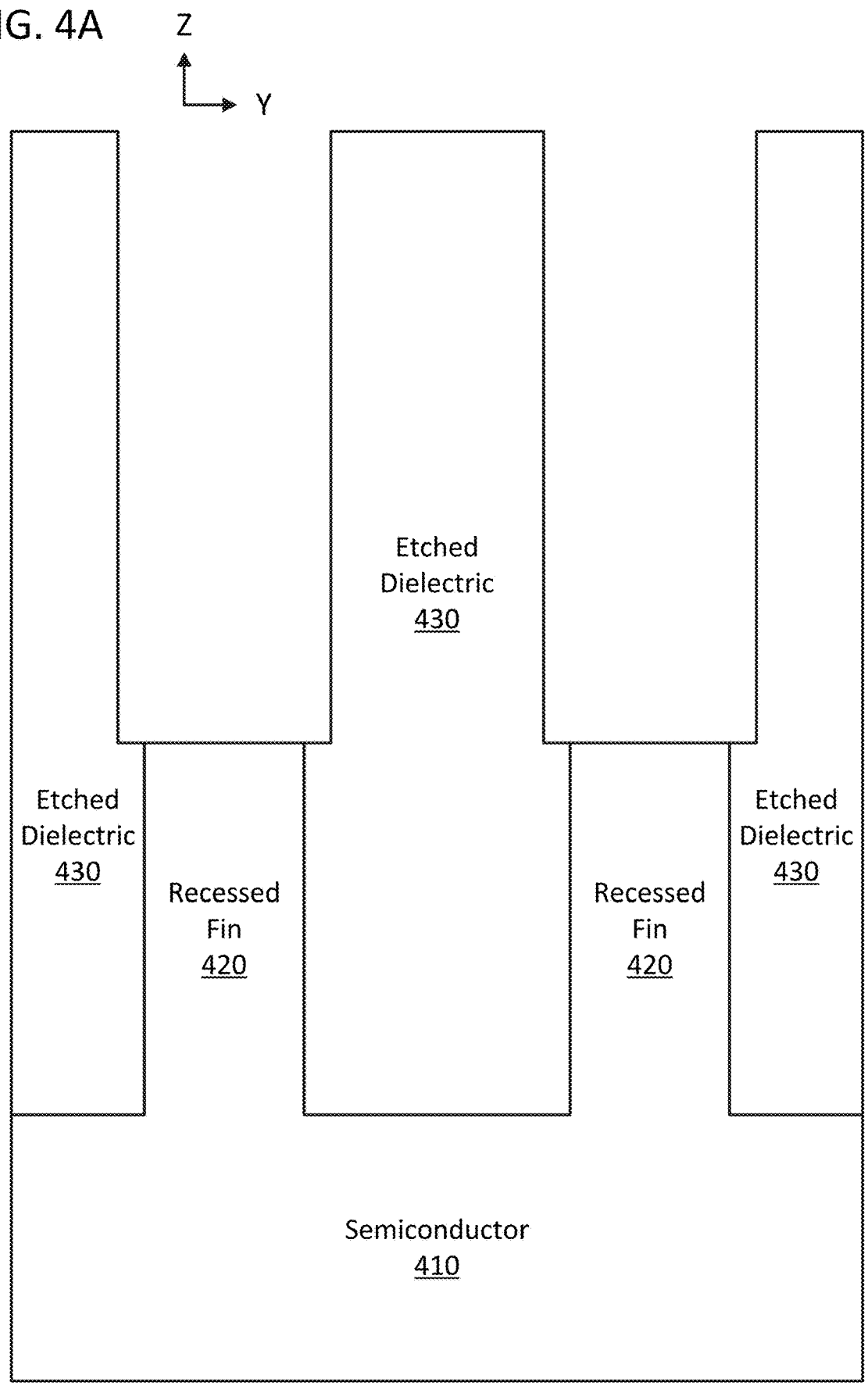
FIGS. 4A-4D are cross-sectional views of an example method of fabricating a stacked transistor architecture, according to an embodiment of the present disclosure.
Figure 4B:
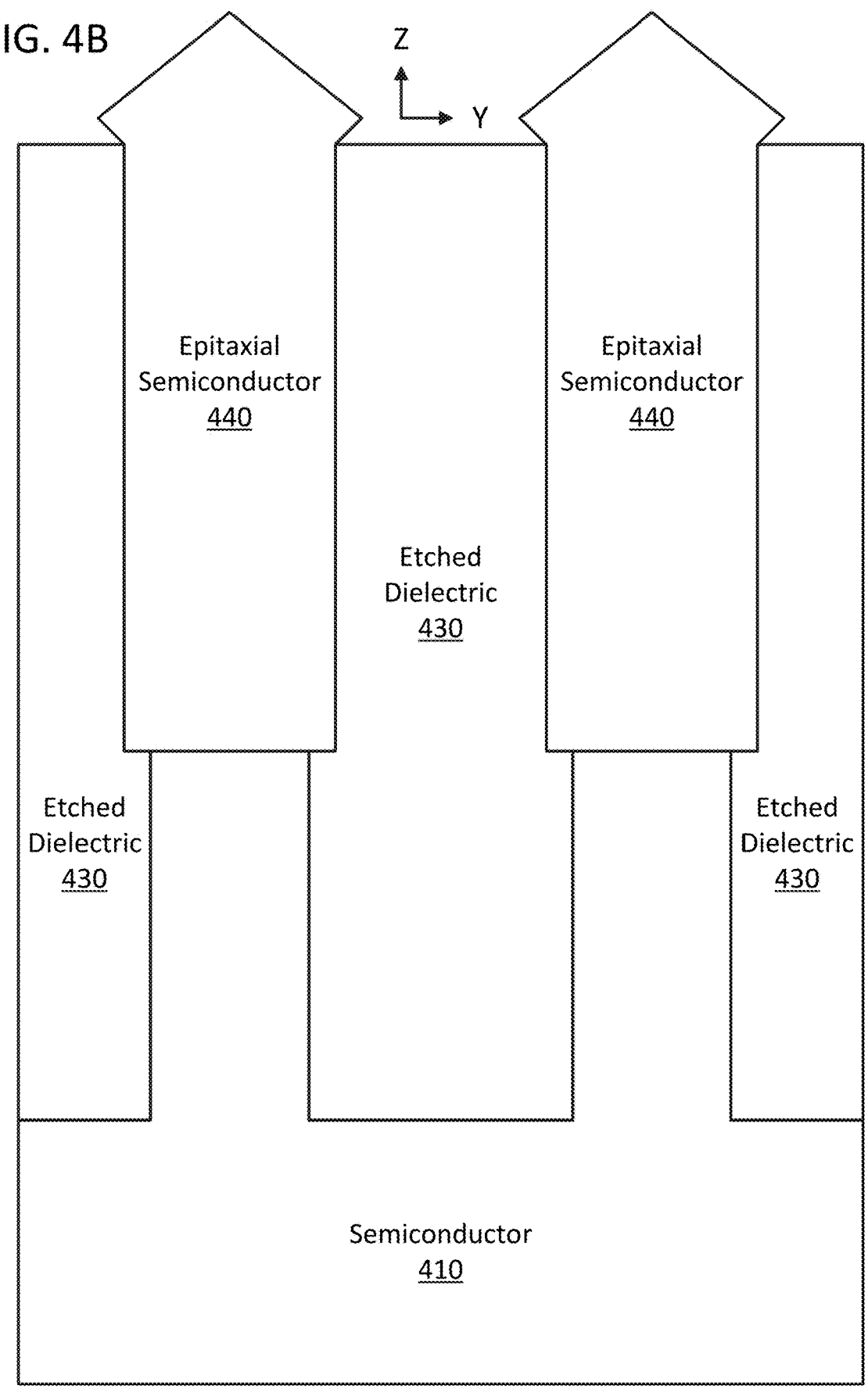

FIGS. 4A-4D are cross-sectional views of an example method of fabricating a stacked transistor architecture, according to an embodiment of the present disclosure. Contrary to the techniques illustrated in FIGS. 2A-2F and 3A-3F, in the method of FIGS. 4A-4D, the goal is produce upper semiconductor fins that are wider than their corresponding lower semiconductor fins. The method has a similar initial process to that shown above for FIGS. 3A-3F, such as the operations leading up to FIG. 3A with planarized dielectric material and recessed fins 420 on base semiconductor 410. In FIG. 4A, the two techniques start to diverge. Instead of forming spacers, in FIG. 4A, a timed selective etch (e.g., wet etch) of the dielectric material is performed to remove a portion of the dielectric material (such as to blow out the ART mold) and widen the evacuated region formed by the recessed fins 420. This produces etched dielectric 430. In FIG. 4B, epitaxial semiconductor 440 is grown in the molds similar to the process illustrated in FIG. 3D, only in this case the mold is wider than the recessed fins 420. For instance, ART can be used to epitaxially grow a different semiconductor 440 in the evacuated (and blown out) dielectric areas between the etched dielectric 430. In another embodiment, the same semiconductor could be deposited (e.g., when a material change is not needed between the lower and upper fins, but a width change is needed).

Figure 4C:
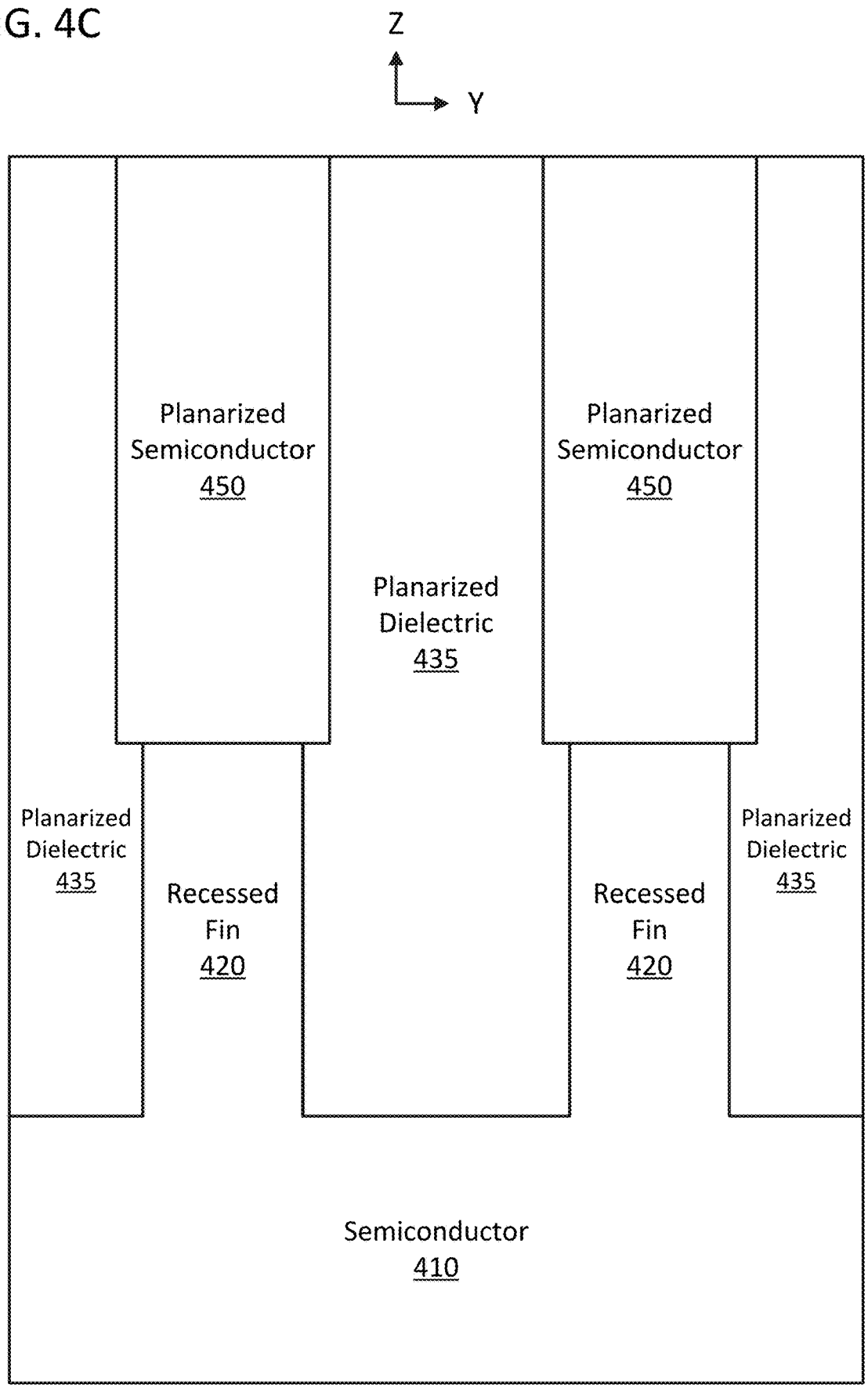
Figure 4D:
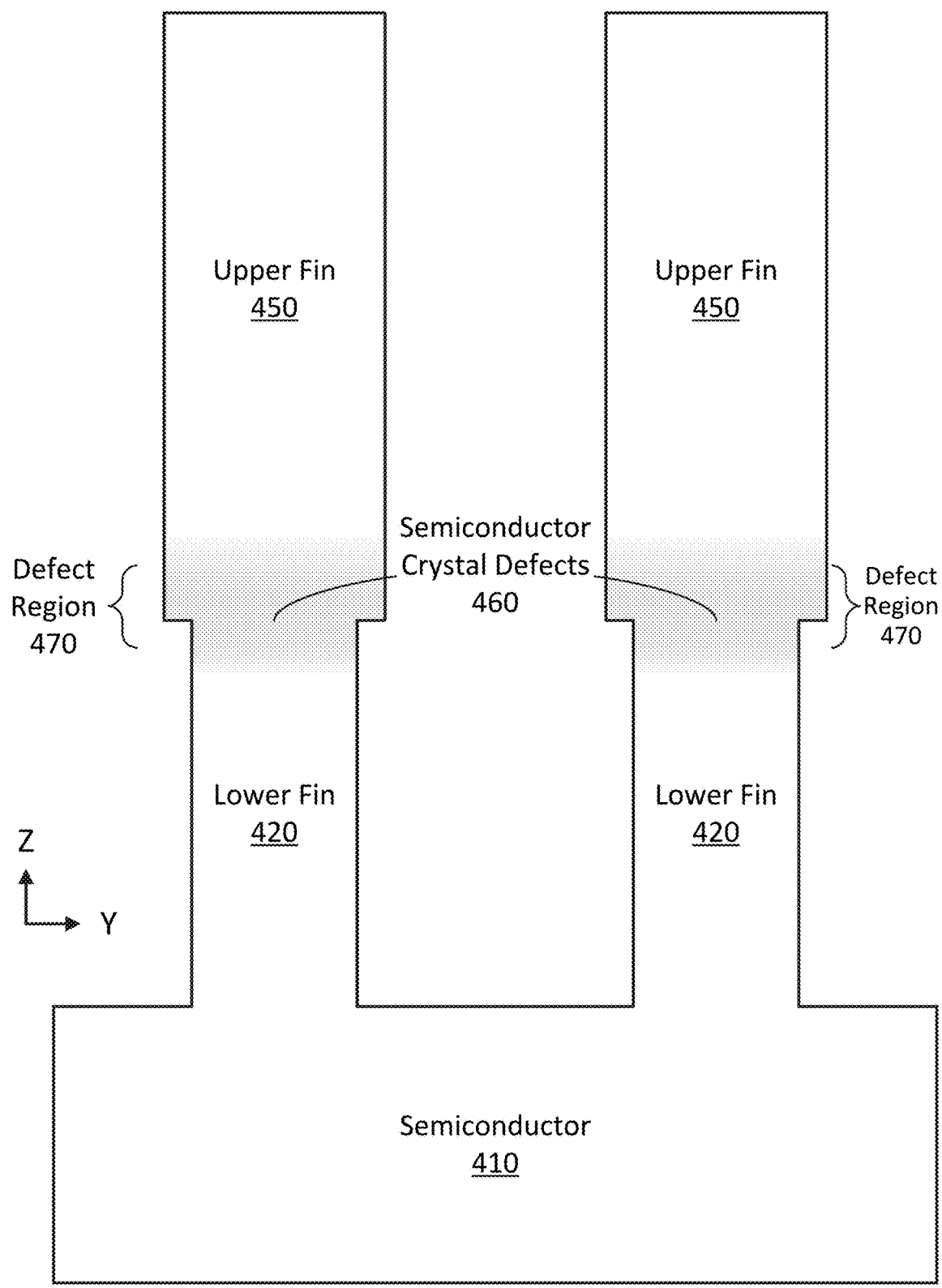

In FIG. 4C (as in FIG. 3E), the epitaxially grown semiconductor 440 and the etched dielectric 430 is planarized to form planarized semiconductor 450 and planarized dielectric 435. In FIG. 4D, the planarized dielectric 435 is removed (e.g., through selective etching) to reveal the upper fins 450 and the lower fins 420, which can be different semiconductor materials. In addition, if a technique such as ART is used to form the upper fins 450 of a different semiconductor material than the lower fins 420, there will be a region 470 of semiconductor crystal defects 460 (similar to that in FIG. 3F) at boundaries between the lower fins 420 and the upper fins 450, with the defect region 470 containing all or most of the defects 460.

Figure 5B:
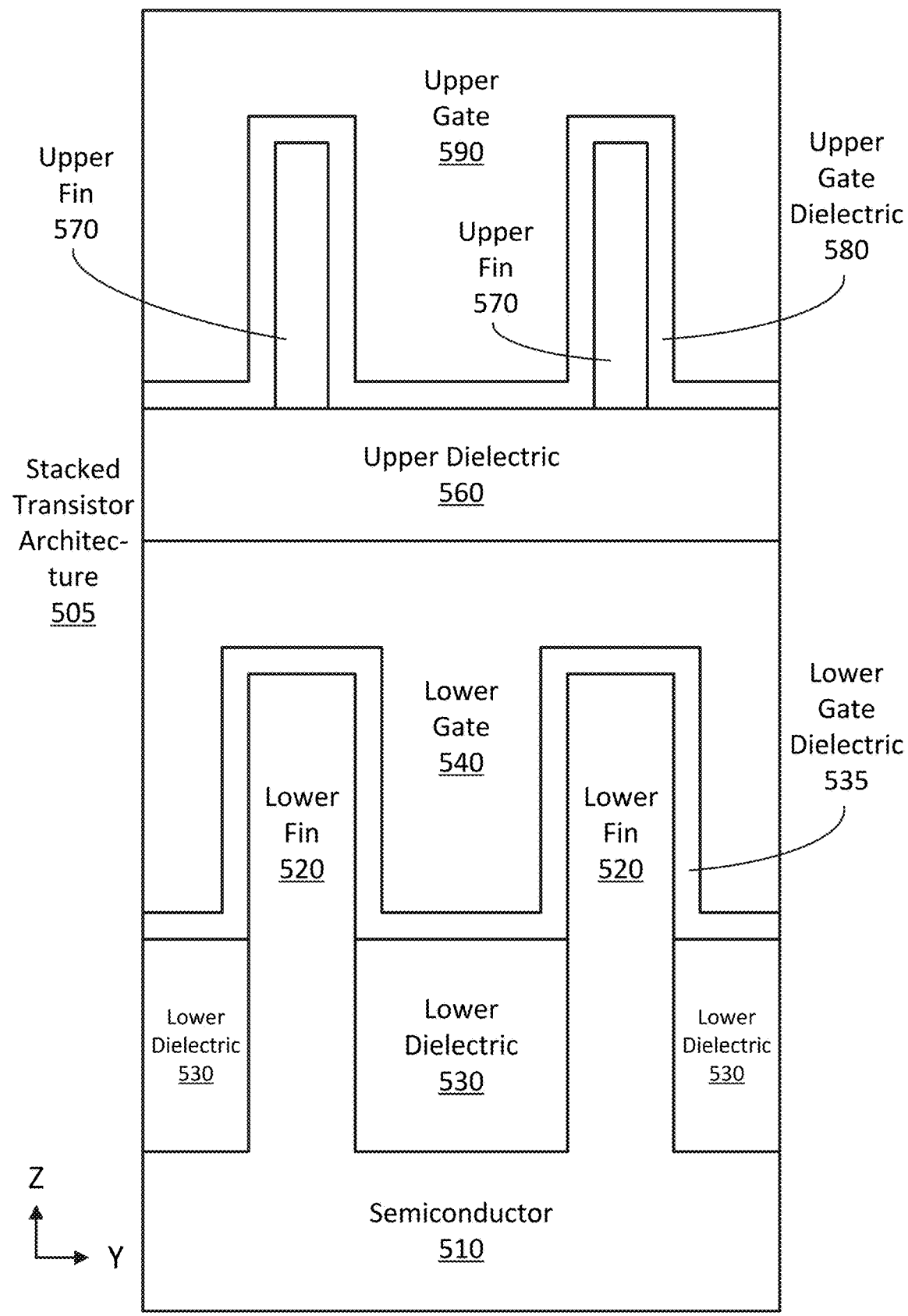

FIGS. 5A-5B are cross-sectional views (similar to FIG. 1A) of example bonding and layer transfer implementations of stacked transistor architectures 500 and 505, according to embodiments of the present disclosure. The semiconductor fin layers in the stacked transistor architectures 500 and 505 are formed as two separate base lithographies. For instance, in the stacked transistor architecture 500, lower fins 520 are formed using one (base) lithography, while upper fins 570 are formed using a different (base) lithography. This contrasts with the examples shown above, where the base semiconductor fins can be formed in one lithography.

In further detail, in the stacked transistor architecture 500 in FIG. 5A, upper and lower device layers make up the transistor architecture 500. The lower device layer includes base semiconductor 510 and corresponding lower fins 520. Lower dielectric 530 (e.g., SiO$_2$) covers the bottoms of the lower fins 520 (e.g., to better electrically isolate the lower fins 520 from one another). Lower gate dielectric 535 (e.g., high-κ material such as HfO$_2$) covers lower fins 520 to electrically insulate the lower fins 520 from lower gate electrode 540 (e.g., metal, conductive oxide, doped semiconductor, or the like). The lower device layer is topped with a layer of etch stop material 550 (such as silicon nitride) and (optionally) planarized.

The upper device layer is formed from a separate substrate, such as upper dielectric 560 (e.g., an insulating dielectric/bonding layer such as SiO$_2$). The upper device layer has a layer of semiconductor material (can be the same or different semiconductor than semiconductor 510) on the upper dielectric 560 prior to bonding with the lower device layer. After bonding the unformed upper device layer to the formed bottom device layer (e.g., through layer transfer or other bonding technique), the upper fins 570 are formed from the upper semiconductor layer. The upper fins 570 can be formed at the same pitch and in vertical alignment with the lower fins 520. An upper gate dielectric 580 and upper gate electrode 590, e.g., similar construction and materials to their lower device layer counterparts (such as lower gate dielectric 535 and lower gate electrode 540), is formed on the upper fins 570 to form the upper transistors.

In some embodiments, the upper fins are formed at the same pitch as the bottom fins, and in the same length direction, but offset (e.g., staggered) vertically in the width direction. In some embodiments, the upper fins are more numerous than the lower fins (e.g., twice as many, or three times as many, or more), and their corresponding pitches are an integer divisor of the bottom fin pitches (e.g., half the pitch, one-third the pitch, or less), with the upper fins being consistently offset with respect to the bottom fins. In some embodiments, the lower fins are more numerous (and with corresponding integer divisors for pitches) than the upper fins, but are consistently offset in the width direction with respect to the upper fins.

The stacked transistor architecture 505 in FIG. 5B is similar to the stacked transistor architecture 500 in FIG. 5A, only the stacked transistor architecture 505 lacks the etch stop layer 550. For example, the upper device layer in the stacked transistor architecture 505 can be layer transferred directly on the lower gate electrode 540 (and other device features, such as source and drain electrodes, and space possibly filled with dielectric), with the lower gate electrode 540 (and other top structures) being (optionally) planarized prior to the layer transfer.

FIG. 6 is a cross-sectional view of an example nanowire stacked transistor architecture 600, according to an embodiment of the present disclosure. In the nanowire stacked transistor architecture 600, the upper device layer includes a set of vertically aligned semiconductor nanowires 660 (the same or different semiconductor material as semiconductor 610), with upper gate dielectric 670 (e.g., high-κ material such as HfO$_2$) surrounding each nanowire 660, and upper gate electrode 680 (e.g., metal, conductive oxide, doped semiconductor, or the like), surrounding the gate-dielectric wrapped nanowires 660. By way of example, the nanowire stacked transistor architecture 600 in FIG. 6 can be formed similarly to the stacked transistor architecture 100 of FIGS. 1A-1B (e.g., semiconductor 610, lower fin 620, lower gate dielectric 635, lower gate electrode 630, dielectric layer 650, and upper isolation layer 690), but with wider fin molds (e.g., blown out ART molds) for the upper fins compared to the lower fins 620.

However, the lower gate dielectric 635 is formed only on the lower fin 620 such that the lower gate electrode 630 is formed directly on the semiconductor 610. Further, instead of forming continuous upper fins (as in FIGS. 1A-1B), in FIG. 6, individual nanowires 660 are formed (e.g., epitaxially grown) vertically in the fin mold, with other material (e.g., replaceable dielectric material) separating the nanowires 660 and that can be removed prior to forming the upper gate dielectric 670.

The nanowires 660 increase the surface area contact between the upper gate structure (e.g., upper gate dielectric 670 and upper gate electrode 680) and the semiconductive channel portion of the upper transistors, which provides for more efficient gate operation. The nanowire device layer integrates well with a FinFET device layer for the stacked device architecture. For instance, a CMOS integration can use Group III-V semiconductor nanowires in the upper device layer for the NMOS transistors and Group IV semiconductor FinFET devices in the lower device layer for the PMOS transistors (having much smaller fin width than the nanowire width). For example, the nanowires can be 50%, 100%, or more wider than the comparable FinFET channel regions in the same integration. In some embodiments, the stacked nanowires are formed from different semiconductors (e.g., epitaxially grown into a superlattice of different materials for the different nanowires making up a device layer).

Figure 7A:
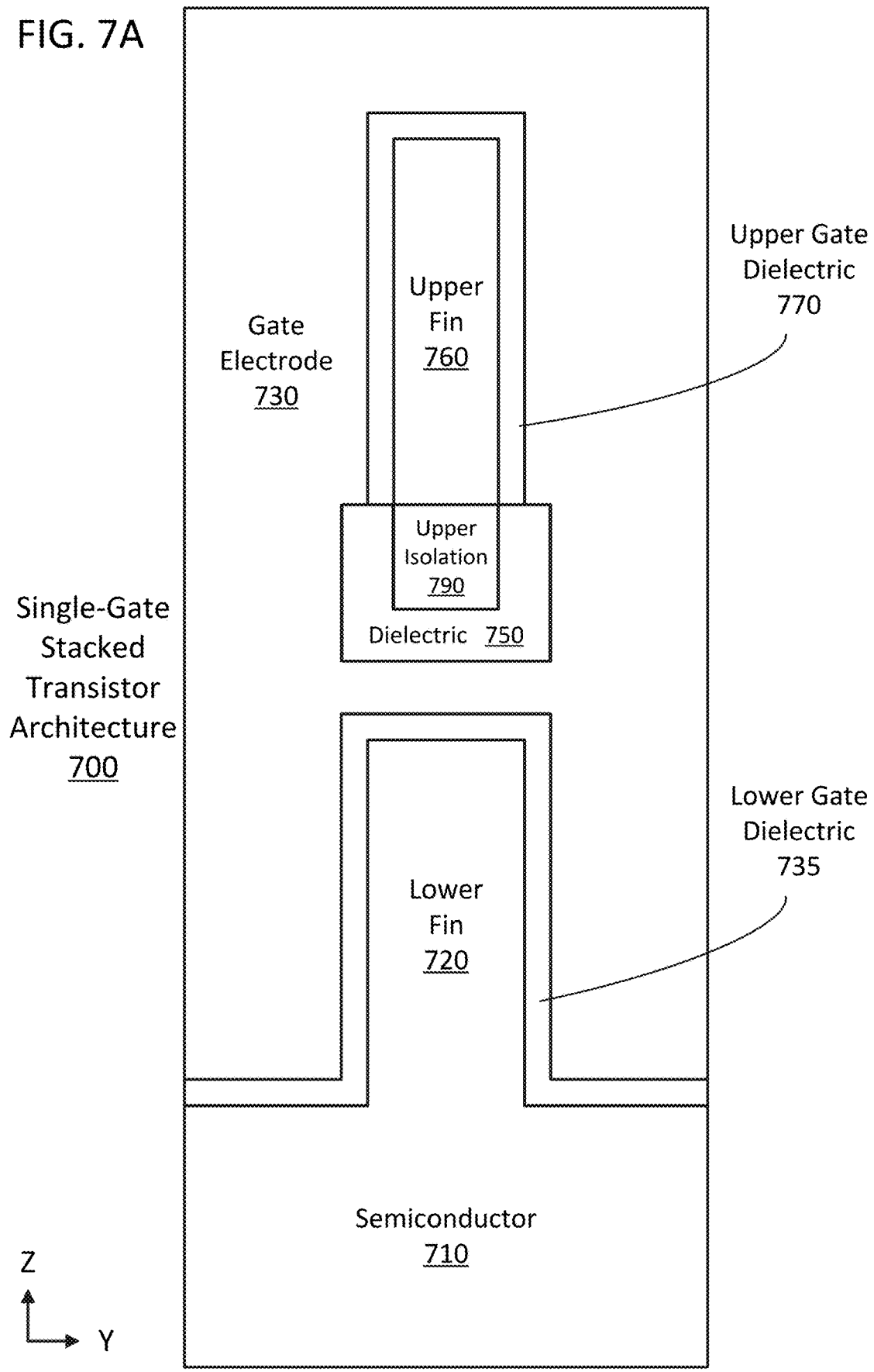

FIGS. 7A-7B are cross-sectional views of an example single-gate stacked transistor architecture 700, according to an embodiment of the present disclosure. In the single-gate stacked transistor architecture 700 of FIGS. 7A-7B, there is an upper device layer (including an upper transistor) and a lower device layer (including a lower transistor). The stacked transistor architecture 700 is similar to that of the stacked transistor architecture 100 of FIGS. 1A-1B, e.g., semiconductor 710, lower fin 720 (including lower source region 722, drain region 724, and channel region 726), lower gate electrode 735, lower isolation later 740, upper isolation layer 790, upper fin 760 (including upper source region 762, drain region 764, and channel region 766), and upper gate dielectric 770, which are similar to their counterparts in the stacked transistor architecture 100. However, the stacked transistor architecture 700 includes a single gate electrode 730 (with modifications to the insulating dielectric region 750) to control both the upper and lower transistors. The lower fin 720 is wider than the upper fin 760. In other embodiments, the lower fin 720 and upper fin 760 share a common gate dielectric layer or common gate dielectric material in place of, or in addition to, a common gate electrode.

Figure 8:
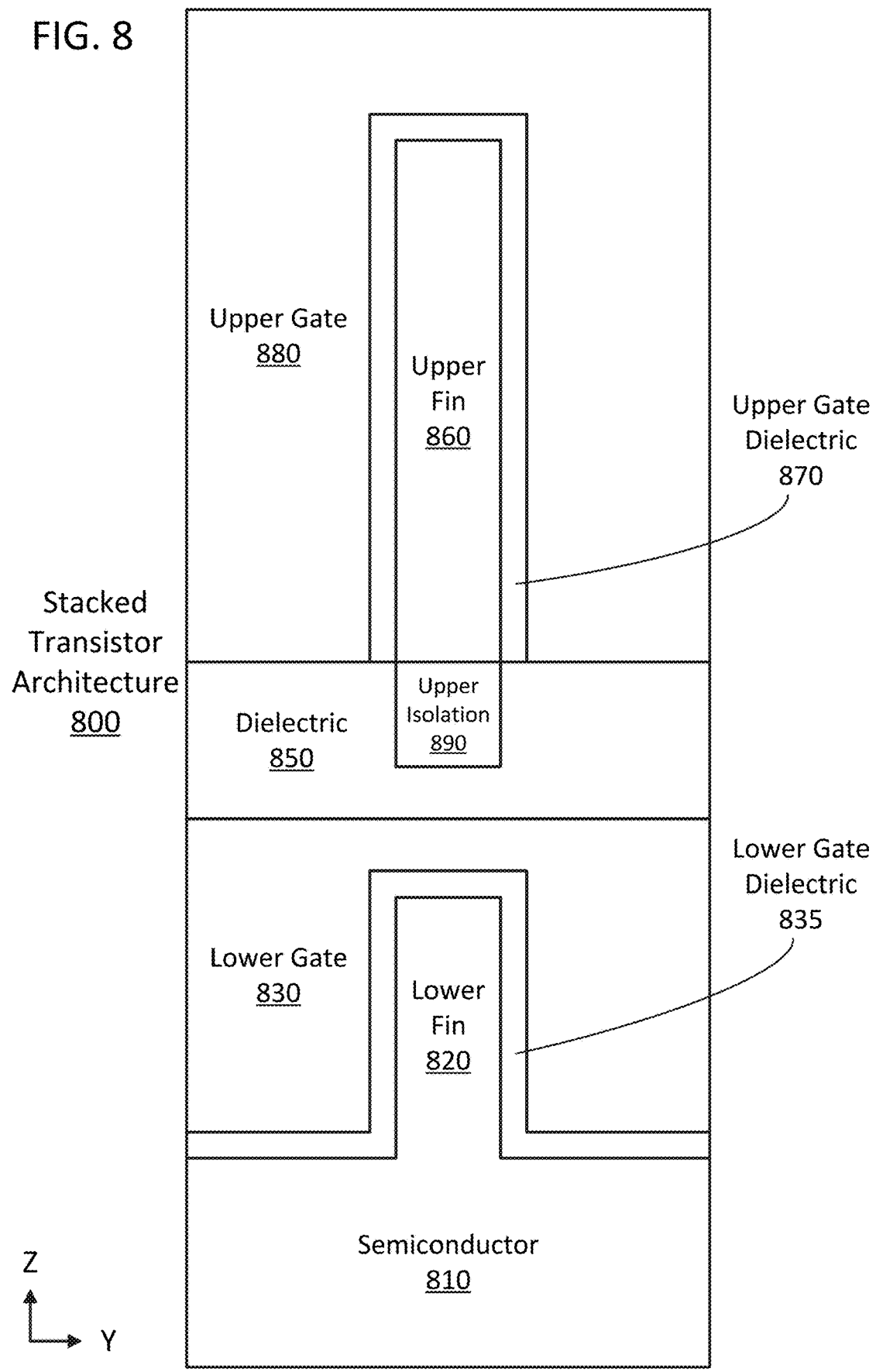
FIG. 8 is a cross-sectional view of an example stacked transistor architecture, according to another embodiment of the present disclosure.

FIG. 8 is a cross-sectional view of an example stacked transistor architecture 800, according to another embodiment of the present disclosure. The stacked transistor architecture 800 of FIG. 8 includes similar components to that of the stacked transistor architecture 100 of FIG. 1A, e.g., semiconductor 810, lower fin 820, lower gate dielectric 835, lower gate electrode 830, insulating dielectric 850, upper isolation layer 890, upper fin 860, upper gate dielectric 870, and upper gate electrode 880, which are similar to their counterparts in the stacked transistor architecture 100 of FIG. 1A. However, in the stacked transistor architecture 800 of FIG. 0.8, the lower fin 820 and upper fin 860 have the same width, but different heights. The upper fin 860 is taller than the lower fin 820. In some embodiments, the height of the lower fin is greater than the height of the upper fin.

FIGS. 9-11 are flow diagrams of example methods 900-1100 of fabricating integrated circuit structures, according to embodiments of the present disclosure. These and other methods disclosed herein may be carried out using integrated circuit fabrication techniques such as photolithography as would be apparent in light of the present disclosure. The corresponding transistors and other devices may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal), either directly or indirectly (such as through one or more conductive layers in between).

Referring to the method 900 of FIG. 9 (with specific example references to the structures or operations of FIGS. 1-8), processing begins with forming 910 semiconductor fins (such as fins 220 in FIG. 2A) extending in a same length direction. Each of the fins includes a lower portion (such as lower fin 120) and an upper portion (such as upper fin 160). The fins define corresponding trenches (such as the empty portion between the two fins 220) between the fins extending in the length direction.

The method 900 further includes filling 920 the trenches with dielectric material (such as dielectric material 230 in FIG. 2B), planarizing 930 the dielectric material to expose top surfaces of upper portions of the fins (see FIG. 2C), removing 940 the upper portions of the fins to expose top surfaces of the lower portions of the fins while leaving cavities (such as the empty portions between adjacent planarized dielectric regions 330 in FIG. 3A) in the dielectric material whose shapes correspond to those of the removed upper portions of the fins, modifying 950 walls of the cavities (such as etched spacers 350 in FIG. 3C) to alter widths of the cavities (e.g., make them wider or narrower) compared to widths of the removed upper portions of the fins, and filling 960 the modified cavities with replacement semiconductor fin material (such as epitaxial semiconductor 360 in FIG. 3D) to form new upper portions of the fins having different widths than the widths of the removed upper portions of the fins.

Referring to the method 1000 of FIG. 10, processing begins with forming 1010 semiconductor fins extending in a same length direction. Each of the fins includes a lower portion and an upper portion. The fins define corresponding trenches between the fins extending in the length direction. The method 1000 further includes filling 1020 the trenches with dielectric material, planarizing 1030 the dielectric material to expose top surfaces of the upper portions of the fins, removing 1040 upper portions of the dielectric material to expose the upper portions of the fins while leaving the lower portions of the fins covered by the dielectric material (see FIG. 2D), and removing 1050 surface portions of the exposed upper portions of the fins to decrease widths of the exposed upper portions of the fins compared to widths of the covered lower portions of the fins (see FIG. 2E).

Referring to the method 1100 of FIG. 11, processing begins with forming 1110 a bottom fin layer having semiconductor bottom fins (such as lower fins 520) extending in a length direction, forming 1120 a bottom transistor including a semiconductor portion of one of the bottom fins, source and drain portions on different sides of and adjacent to the semiconductor portion, a gate dielectric on the semiconductor portion, and a gate electrode on the gate dielectric (see FIGS. 1A-1B), filling 1130 spaces in the bottom fin layer with dielectric material and planarizing the bottom fin layer, bonding 1140 a semiconductor layer to the planarized bottom fin layer with a dielectric bonding layer (such as upper dielectric layer 560), and forming 1150 a top fin layer by forming semiconductor top fins (such as upper fins 570) from the semiconductor layer. The top fins extend in the length direction and are vertically aligned (see FIG. 5A) or are consistently offset in a width direction with the bottom fins. The width of the semiconductor portion is different than the width of the top fins.

While the above example methods appear as a series of operations or stages, it is to be understood that there is no required order to the operations or stages unless specifically indicated.

Example System

Figure 12:
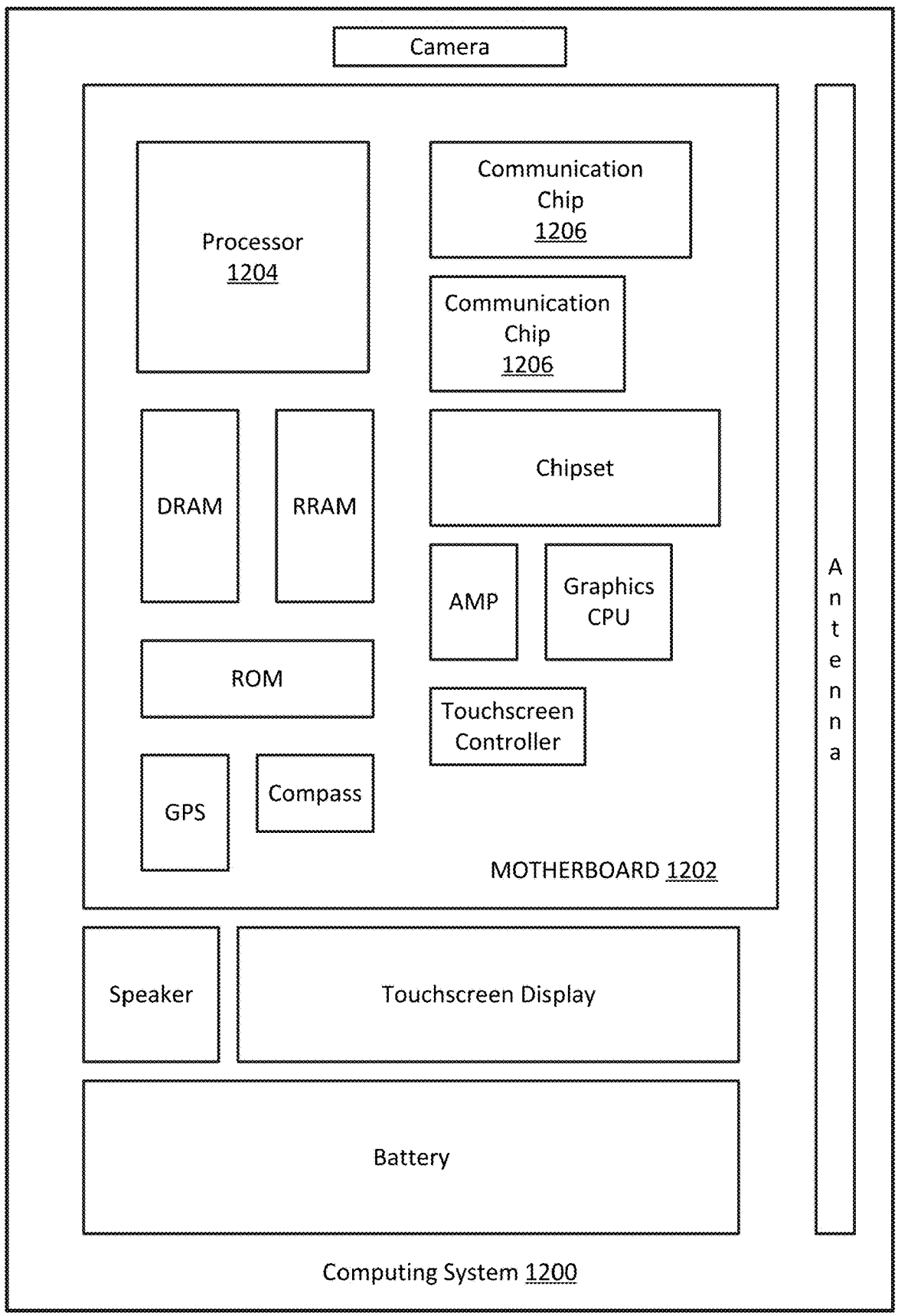
FIG. 12 illustrates an example computing system implemented with the integrated circuit structures or techniques disclosed herein, according to an embodiment of the present disclosure.

FIG. 12 illustrates a computing system 1200 implemented with the integrated circuit structures or techniques disclosed herein, according to an embodiment of the present disclosure. As can be seen, the computing system 1200 houses a motherboard 1202. The motherboard 1202 may include a number of components, including, but not limited to, a processor 1204 (including stacked transistor structures as described herein) and at least one communication chip 1206, each of which can be physically and electrically coupled to the motherboard 1202, or otherwise integrated therein. As will be appreciated, the motherboard 1202 may be, for example, any printed circuit board, whether a main board, a daughterboard mounted on a main board, or the only board of system 1200, to name a few examples.

Depending on its applications, computing system 1200 may include one or more other components that may or may not be physically and electrically coupled to the motherboard 1202. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1200 may include one or more integrated circuit structures or devices (e.g., one or more memory cells) formed using the disclosed techniques in accordance with an example embodiment. In some embodiments, multiple functions can be integrated into one or more chips (e.g., for instance, note that the communication chip 1206 can be part of or otherwise integrated into the processor 1204).

The communication chip 1206 enables wireless communications for the transfer of data to and from the computing system 1200. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing system 1200 includes an integrated circuit die packaged within the processor 1204. In some embodiments, the integrated circuit die of the processor includes onboard circuitry that is implemented with one or more integrated circuit structures or devices (e.g., stacked transistor structures) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1206 also may include an integrated circuit die packaged within the communication chip 1206. In accordance with some such example embodiments, the integrated circuit die of the communication chip includes one or more integrated circuit structures or devices (e.g., stacked transistor architectures) formed using the disclosed techniques as variously described herein. As will be appreciated in light of this disclosure, note that multi-standard wireless capability may be integrated directly into the processor 1204 (e.g., where functionality of any chips 1206 is integrated into processor 1204, rather than having separate communication chips). Further note that processor 1204 may be a chip set having such wireless capability. In short, any number of processor 1204 and/or communication chips 1206 can be used. Likewise, any one chip or chip set can have multiple functions integrated therein.

In various implementations, the computing device 1200 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., stacked transistor architectures) formed using the disclosed techniques, as variously described herein.

FURTHER EXAMPLE EMBODIMENTS

The following examples pertain to further embodiments, from which numerous permutations and configurations will be apparent.

Example 1 is an integrated circuit (IC) structure including: a top semiconductor fin extending in a length direction; a bottom semiconductor fin extending in the length direction, the bottom semiconductor fin being under and vertically aligned with the top semiconductor fin; a top gate structure in contact with a portion of the top semiconductor fin; a top source region and a top drain region each adjacent to the portion of the top semiconductor fin, such that the portion of the top semiconductor fin is between the top source region and the top drain region; a bottom gate structure in contact with a portion of the bottom semiconductor fin; and a bottom source region and a bottom drain region each adjacent to the portion of the bottom semiconductor fin, such that the portion of the bottom semiconductor fin is between the bottom source region and the bottom drain region, where heights, widths, or both the heights and widths of the portions of the top and bottom semiconductor fins are different.

Example 2 includes the IC structure of Example 1, where one or both of the height and width of the top semiconductor fin is or are different by at least ten percent from the one or both of the height and width of the bottom semiconductor fin.

Example 3 includes the IC structure of any of Examples 1-2, where the portion of the top semiconductor fin includes a first semiconductor material, and the portion of the bottom semiconductor fin includes a second semiconductor material different than the first semiconductor material.

Example 4 includes the IC structure of any of Examples 1-3, where the top source and drain regions include one of n-type and p-type dopant, and the bottom source and drain regions include the other of n-type and p-type dopant.

Example 5 includes the IC structure of Example 4, where the portion of the semiconductor fin adjacent to the n-type source and drain regions includes a Group III-V semiconductor, and the portion of the semiconductor fin adjacent to the p-type source and drain regions includes a Group IV semiconductor.

Example 6 includes the IC structure of any of Examples 4-5, where the width of the portion of the semiconductor fin adjacent to the n-type source and drain regions is larger than the width of the portion of the semiconductor fin adjacent to the p-type source and drain regions.

Example 7 includes the IC structure of Example 6, where the portion of the semiconductor fin adjacent to the n-type source and drain regions includes a nanowire structure having one or more semiconductor nanowires.

Example 8 includes the IC structure of any of Examples 1-6, where one or more of the portions of the top and bottom semiconductor fins include a nanowire structure having one or more semiconductor nanowires.

Example 9 includes the IC structure of any of Examples 1-8, further including a region of semiconductor crystal defects at a top portion of the portion of the bottom semiconductor fin.

Example 10 includes the IC structure of any of Examples 1-9, further including one or more layers of insulation material between the top and bottom semiconductor fins.

Example 11 includes the IC structure of any of Examples 1-10, further including: a third semiconductor fin extending in the length direction, the semiconductor fin being under or above and vertically aligned with the top and bottom semiconductor fins; a third gate structure in contact with a portion of the third semiconductor fin; and a third source region and a third drain region each adjacent to the portion of the third semiconductor fin, such that the portion of the third semiconductor fin is between the third source region and the third drain region.

Example 12 includes the IC structure of Example 11, where for any two semiconductor fins of the top, bottom, and third semiconductor fins, the heights, widths, or both the heights and widths of the portions of the two semiconductor fins are different.

Example 13 includes the IC structure of any of Examples 1-12, where the top gate structure and the bottom gate structure each include a gate dielectric and a gate electrode, and the gate dielectric of the top gate structure includes the same material as the gate dielectric of the bottom gate structure.

Example 14 includes the IC structure of any of Examples 1-13, where a gate electrode of the top gate structure is compositionally different from a gate electrode of the bottom gate structure with respect to at least one of dopant type and elemental metal.

Example 15 is a stacked transistor structure including: a top set of two or more transistors having corresponding semiconductor fin structures extending in a length direction, the top set including a top transistor having a top semiconductor fin structure, and a source region and a drain region separated by and physically connected to a portion of the top semiconductor fin structure; and a bottom set of two or more transistors having corresponding semiconductor fin structures extending in the length direction, the semiconductor fin structures in the bottom set being under and consistently offset in a width direction with the semiconductor fin structures of the top set, the bottom set including a bottom transistor having a bottom semiconductor fin structure, and a source region and a drain region separated by and physically connected to a portion of the bottom semiconductor fin structure, where a height, width, or both the height and width of the portion of the top semiconductor fin structure is different from the height, width, or both the height and width of the bottom semiconductor fin structure.

Example 16 includes the stacked transistor structure of Example 15, where consistently offset in the width direction means the semiconductor fin structures in the top set and the semiconductor fin structures in the bottom set have corresponding pitches that are integer multiples or integer divisors of one another.

Example 17 includes the stacked transistor structure of any of Example 15-16, where consistently offset in the width direction means the semiconductor fin structures in the top set have the same pitch as the semiconductor fin structures in the bottom set.

Example 18 includes the stacked transistor structure of any of Examples 15-17, where one or both of the height and width of the portion of the top semiconductor fin structure is or are different by at least ten percent from the one or both of the height and width of the portion of the bottom semiconductor fin structure.

Example 19 includes the stacked transistor structure of any of Examples 15-18, where the portion of the top semiconductor fin structure includes a first semiconductor material, and the portion of the bottom semiconductor fin structure includes a second semiconductor material different than the first semiconductor material.

Example 20 includes the stacked transistor structure of any of Examples 15-19, where the source and drain regions of the top transistor include one of n-type and p-type dopant, and the source and drain regions of the bottom transistor include the other of n-type and p-type dopant.

Example 21 includes the stacked transistor structure of Example 20, where the one of the top and bottom transistors having the portion of the semiconductor fin structure physically connected to the n-type source and drain regions is an n-type metal oxide semiconductor (NMOS) transistor, the other of the top and bottom transistors is a p-type MOS (PMOS) transistor, and the NMOS and PMOS transistors make up a complementary MOS (CMOS) transistor structure.

Example 22 includes the stacked transistor structure of Example 21, where the semiconductor fin structure of the NMOS transistor includes a Group III-V semiconductor, and the semiconductor fin structure of the PMOS transistor includes a Group IV semiconductor.

Example 23 includes the stacked transistor structure of any of Examples 21-22, where the width of the portion of the semiconductor fin structure of the NMOS transistor is larger than the width of the portion of the semiconductor fin structure of the PMOS transistor.

Example 24 includes the stacked transistor structure of Example 23, where the semiconductor fin structure of the NMOS transistor includes a nanowire structure having one or more semiconductor nanowires, and the PMOS transistor has a FinFET (fin field-effect transistor) structure.

Example 25 includes the stacked transistor structure of any of Examples 15-23, where one or both of the semiconductor fin structures of the top and bottom transistors include a nanowire structure having one or more semiconductor nanowires.

Example 26 includes the stacked transistor structure of Example 25, where one of the top and bottom transistors has a FinFET (fin field-effect transistor) structure.

Example 27 includes the stacked transistor structure of any of Examples 15-26, further including a region of semiconductor crystal defects at a top portion of the bottom semiconductor fin structure.

Example 28 includes the stacked transistor structure of any of Examples 15-27, further including a layer of insulating material between the top and bottom sets, the layer being between the top and bottom semiconductor fin structures.

Example 29 includes the stacked transistor structure of any of Examples 15-28, further including a third set of two or more transistors having corresponding semiconductor fin structures extending in the length direction, the semiconductor fin structures in the third set being under or above and consistently offset in the width direction with the semiconductor fin structures of the top and bottom sets, the third set including a third transistor having a third semiconductor fin structure, and a source region and a drain region separated by and physically connected to a portion of the third semiconductor fin structure.

Example 30 includes the stacked transistor structure of Example 29, where for any two of the top, bottom, and third semiconductor fin structures, the heights, widths, or both the heights and widths of the portions of the two semiconductor fin structures are different.

Example 31 includes the stacked transistor structure of any of Examples 15-30, where each of the top and bottom transistors includes a gate dielectric structure on the portion of the semiconductor fin structure and a gate electrode on the gate dielectric structure.

Example 32 is a method of fabricating an integrated circuit (IC) structure, the method including: forming semiconductor fins extending in a same length direction, each of the fins including a lower portion and an upper portion, the fins defining corresponding trenches between the fins extending in the length direction; filling the trenches with dielectric material; removing the upper portions of the fins to expose top surfaces of the lower portions of the fins while leaving cavities in the dielectric material whose shapes correspond to those of the removed upper portions of the fins; modifying walls of the cavities to alter widths of the cavities compared to widths of the removed upper portions of the fins; and filling the modified cavities with replacement semiconductor fin material to form new upper portions of the fins having different widths than the widths of the removed upper portions of the fins.

Example 33 includes the method of Example 32, where the filling of the modified cavities includes epitaxially growing the replacement semiconductor fin material from the top surfaces of the lower portions of the fins in the modified cavities.

Example 34 includes the method of Example 32, where the filling of the modified cavities with the replacement semiconductor fin material includes forming nanowire structures in the modified cavities, each of the nanowire structures having one or more semiconductor nanowires.

Example 35 includes the method of Example 34, where the widths of the modified cavities are greater than widths of the lower portions of the fins.

Example 36 includes the method of any of Examples 32-35, where the modifying of the walls of the cavities includes removing surface portions of the dielectric material of the walls to increase the widths of the cavities.

Example 37 includes the method of any of Examples 32-34, where the modifying of the walls of the cavities includes forming spacers on the walls of the cavities to reduce the widths of the cavities.

Example 38 includes the method of any of Examples 32-37, where the replacement semiconductor fin material is a different semiconductor than a semiconductor fin material of the lower portions of the fins.

Example 39 includes the method of Example 38, where one of the replacement semiconductor fin material and the semiconductor fin material of the lower portions of the fins is a Group III-V semiconductor and another is a Group IV semiconductor.

Example 40 includes the method of Example 39, where widths of the Group III-V semiconductor portions of the fins are larger than widths of the Group IV semiconductor portions of the fins.

Example 41 includes the method of any of Examples 32-40, further including removing the dielectric material after the filling of the modified cavities to reveal the new upper portions of the fins vertically aligned with and having different widths than the lower portions of the fins.

Example 42 is a method of fabricating an integrated circuit (IC) structure, the method including: forming semiconductor fins extending in a same length direction, each of the fins including a lower portion and an upper portion, the fins defining corresponding trenches between the fins extending in the length direction; filling the trenches with dielectric material; removing upper portions of the dielectric material to expose the upper portions of the fins while leaving the lower portions of the fins covered by the dielectric material; and removing surface portions of the exposed upper portions of the fins to decrease widths of the exposed upper portions of the fins compared to widths of the covered lower portions of the fins.

Example 43 includes the method of Example 42, further including removing the dielectric material after the removing of the surface portions of the exposed upper portions of the fins to reveal thinned said upper portions of the fins vertically aligned with and having smaller widths than the lower portions of the fins.

Example 44 is a method of fabricating an integrated circuit (IC) structure, the method including: forming a bottom fin layer having semiconductor bottom fins extending in a length direction; forming a bottom transistor including a semiconductor portion of one of the bottom fins, source and drain portions on different sides of and adjacent to the semiconductor portion, a gate dielectric on the semiconductor portion, and a gate electrode on the gate dielectric; filling spaces in the bottom fin layer with dielectric material and planarizing the bottom fin layer; bonding a semiconductor layer to the planarized bottom fin layer with a dielectric bonding layer; and forming a top fin layer by forming semiconductor top fins from the semiconductor layer, the top fins extending in the length direction and being vertically aligned or consistently offset in a width direction with the bottom fins, where the width of the semiconductor portion is different than the width of the top fins.

Example 45 includes the method of Example 44, where the planarizing of the bottom fin layer includes forming an etch stop layer on the bottom fin layer.

Example 46 includes the method of any of Examples 44-45, where consistently offset in the width direction means having corresponding pitches that are integer multiples or integer divisors of one another.

Example 47 includes the method of any of Examples 44-46, where consistently offset in the width direction means having the same pitch.

Example 48 includes the method of any of Examples 44-47, where the width is different means differing by at least ten percent.

Example 49 includes the method of any of Examples 44-48, further including forming a top transistor including a semiconductor portion of one of the top fins, source and drain portions on different sides of and adjacent to the semiconductor portion, a gate dielectric on the semiconductor portion, and a gate electrode on the gate dielectric.

Example 50 includes the method of Example 49, where the semiconductor portion of the one of the bottom fins includes a different material than the semiconductor portion of the one of the top fins.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) structure comprising:
   a top fin comprising semiconductor material and extending in a length direction;
   a bottom fin comprising semiconductor material and extending in the length direction, the bottom fin being under and vertically aligned with the top fin;
   a top gate structure in contact with a portion of the top fin;
   a top source region and a top drain region each adjacent to the portion of the top fin, such that the portion of the top fin is between the top source region and the top drain region;
   a bottom gate structure in contact with a portion of the bottom fin; and
   a bottom source region and a bottom drain region each adjacent to the portion of the bottom fin, such that the portion of the bottom fin is between the bottom source region and the bottom drain region;
   wherein heights, widths, or both the heights and widths of the portions of the top and bottom fins are different.

2. The IC structure of claim 1, wherein one or both of the height and width of the top fin is or are different by at least ten percent from the one or both of the height and width of the bottom fin.

3. The IC structure of claim 1, wherein the portion of the top fin comprises a first semiconductor material, and the portion of the bottom fin comprises a second semiconductor material compositionally different than the first semiconductor material.

4. The IC structure of claim 1, wherein the top source and drain regions include one of n-type and p-type dopant, and the bottom source and drain regions include the other of n-type and p-type dopant.

5. The IC structure of claim 4, wherein the fin portion fin adjacent to the n-type source and drain regions comprises a Group III-V semiconductor, and the fin portion adjacent to the p-type source and drain regions comprises a Group IV semiconductor.

6. The IC structure of claim 4, wherein the width of the fin portion adjacent to the n-type source and drain regions is larger than the width of the fin portion adjacent to the p-type source and drain regions.

7. The IC structure of claim 6, wherein the fin portion adjacent to the n-type source and drain regions comprises a nanowire structure having one or more semiconductor nanowires.

8. The IC structure of claim 1, wherein one or both of the portions of the top and bottom fins comprise a nanowire structure having one or more semiconductor nanowires.

9. The IC structure of claim 1, further comprising one or more layers of insulation material between the top and bottom fins.

10. The IC structure of claim 1, further comprising:
a third fin comprising semiconductor material and extending in the length direction, the third fin being under or above and vertically aligned with the top and bottom fins;
a third gate structure in contact with a portion of the third fin; and
a third source region and a third drain region each adjacent to the portion of the third fin, such that the portion of the third fin is between the third source region and the third drain region.

11. The IC structure of claim 10, wherein for any two fins of the top, bottom, and third fins, the heights, widths, or both the heights and widths of the portions of the two fins are different.

12. The IC structure of claim 1, wherein the top gate structure and the bottom gate structure each include a gate dielectric and a gate electrode, and the gate dielectric of the top gate structure comprises the same material as the gate dielectric of the bottom gate structure.

13. The IC structure of claim 1, wherein a gate electrode of the top gate structure is compositionally different from a gate electrode of the bottom gate structure with respect to at least one of dopant type and elemental metal.

14. The IC structure of claim 1, further comprising a region of semiconductor crystal defects at a top portion of the portion of the bottom fin.

15. A stacked transistor structure comprising:
a top set of transistors, the top set including first and second top transistors each having a portion of a top fin structure, and a source region and a drain region separated by and physically connected to the corresponding portion of the top fin structure; and
a bottom set of transistors, the bottom set including first and second bottom transistors each having a portion of a bottom fin structure, and a source region and a drain region separated by and physically connected to a corresponding portion of the bottom fin structure;
wherein a height, width, or both the height and width of the portion of the top fin structure is different from the height, width, or both the height and width of the bottom fin structure; and
wherein the top fin structure is aligned with the bottom fin structure.

16. The stacked transistor structure of claim 15, wherein the first top transistor corresponds to a first top fin structure and the second top transistor corresponds to a second top fin structure that is parallel to the first top fin structure, and wherein the first bottom transistor corresponds to a first bottom fin structure and the second bottom transistor corresponds to a second bottom fin structure that is parallel to the first bottom fin structure, and wherein the first and second bottom fin structures are under and consistently offset in a width direction with the first and second top fin structures, such that the first and second top fin structures and the first and second bottom fin structures have corresponding pitches that are integer multiples or integer divisors of one another.

17. The stacked transistor structure of claim 15, wherein the first top transistor corresponds to a first top fin structure and the second top transistor corresponds to a second top fin structure that is parallel to the first top fin structure, and wherein the first bottom transistor corresponds to a first bottom fin structure and the second bottom transistor corresponds to a second bottom fin structure that is parallel to the first bottom fin structure, and wherein the first and second top fin structures have the same pitch as the first and second bottom fin structures.

18. An integrated circuit (IC) structure comprising:
a top fin structure comprising semiconductor material and extending in a length direction;
a bottom fin structure comprising semiconductor material and extending in the length direction, the bottom fin being under and vertically aligned with the top fin structure;
a top gate structure in contact with at least a portion of the semiconductor material of the top fin structure;
a top source region and a top drain region each adjacent to the portion of the top fin structure, such that the portion of the top fin structure is between the top source region and the top drain region;
a bottom gate structure in contact with at least a portion of the semiconductor material of the bottom fin structure; and
a bottom source region and a bottom drain region each adjacent to the portion of the bottom fin structure, such that the portion of the bottom fin structure is between the bottom source region and the bottom drain region;
wherein the bottom fin structure has an upper portion and the top fin structure has a lower portion, and the widest width of the upper portion is different from the widest width of the lower portion by 10 percent of more.

19. The IC structure of claim 18, wherein the portion of the top fin structure comprises a first semiconductor material, and the portion of the bottom fin structure comprises a second semiconductor material that is compositionally different from the first semiconductor material.

20. The IC structure of claim 18, wherein the portion of the top fin structure comprises a nanowire or nanoribbon, or the portion of the bottom fin structure comprises a nanowire or nanoribbon, or both portions each comprise a nanowire or nanoribbon.

* * * * *